US012369402B2

(12) United States Patent
Yamazaki et al.

(10) Patent No.: US 12,369,402 B2
(45) Date of Patent: Jul. 22, 2025

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Kenichi Okazaki, Tochigi (JP); Daisuke Kurosaki, Tochigi (JP); Yasutaka Nakazawa, Tochigi (JP); Kazunori Watanabe, Tokyo (JP); Koji Kusunoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/387,146

(22) Filed: Nov. 6, 2023

(65) Prior Publication Data

US 2024/0072065 A1 Feb. 29, 2024

Related U.S. Application Data

(63) Continuation of application No. 17/944,275, filed on Sep. 14, 2022, now Pat. No. 11,837,607, which is a
(Continued)

(30) Foreign Application Priority Data

Nov. 30, 2016 (JP) ................................. 2016-233560
May 18, 2017 (JP) ................................. 2017-099002

(51) Int. Cl.
*H10D 86/60* (2025.01)
*G02F 1/1368* (2006.01)
(Continued)

(52) U.S. Cl.
CPC ........... *H10D 86/60* (2025.01); *G02F 1/1368* (2013.01); *G06F 3/04166* (2019.05);
(Continued)

(58) Field of Classification Search
CPC ............... H10D 86/60; H10D 30/6755; H10D 30/6757; H10D 86/425; H10D 86/481;
(Continued)

(56) References Cited

U.S. PATENT DOCUMENTS 7,674,650 B2    3/2010   Akimoto et al.
7,732,819 B2    6/2010   Akimoto et al.
(Continued)

FOREIGN PATENT DOCUMENTS

CN    101750820 A    6/2010
CN    103824886 A    5/2014
(Continued)

OTHER PUBLICATIONS

Chinese Office Action (Application No. 202210623749.6) Dated Mar. 22, 2024.
(Continued)

*Primary Examiner* — Mariam Qureshi
(74) *Attorney, Agent, or Firm* — Fish & Richardson P.C.

(57) ABSTRACT

A display device includes a liquid crystal element, a transistor, a scan line, and a signal line. The liquid crystal element includes a pixel electrode, a liquid crystal layer, and a common electrode. The scan line and the signal line are each electrically connected to the transistor. The scan line and the signal line each include a metal layer. The transistor is electrically connected to the pixel electrode. A semiconductor layer of the transistor includes a stack of a first metal oxide layer and a second metal oxide layer. The first metal oxide layer includes a region with lower crystallinity than the second metal oxide layer. The transistor includes a first
(Continued)

region connected to the pixel electrode. The pixel electrode, the common electrode, and the first region are each configured to transmit visible light. Visible light passes through the first region and the liquid crystal element and exits from the display device.

3 Claims, 23 Drawing Sheets

Related U.S. Application Data continuation of application No. 16/999,237, filed on Aug. 21, 2020, now Pat. No. 11,456,320, which is a continuation of application No. 15/820,965, filed on Nov. 22, 2017, now Pat. No. 10,756,118.

(51) Int. Cl.
  *G06F 3/041* (2006.01)
  *G06F 3/044* (2006.01)
  *H10D 30/67* (2025.01)
  *H10D 86/40* (2025.01)

(52) U.S. Cl.
  CPC ....... *G06F 3/0446* (2019.05); *H10D 30/6755* (2025.01); *H10D 30/6757* (2025.01); *H10D 86/425* (2025.01)

(58) Field of Classification Search
  CPC ................ H10D 86/423; G02F 1/1368; G02F 1/134345; G02F 1/136295; G02F 2202/10; G02F 2203/01; G02F 1/13439; G02F 1/136286; G02F 2201/123; G06F 3/04166; G06F 3/0446; G06F 2203/04103; G06F 3/033; G06F 3/0412
  See application file for complete search history.

(56) References Cited

U.S. PATENT DOCUMENTS

| | | |
|---|---|---|
| 7,872,259 B2 | 1/2011 | Den et al. |
| 7,910,490 B2 | 3/2011 | Akimoto et al. |
| 7,932,521 B2 | 4/2011 | Akimoto et al. |
| 8,174,021 B2 | 5/2012 | Oikawa et al. |
| 8,212,252 B2 | 7/2012 | Den et al. |
| 8,274,077 B2 | 9/2012 | Akimoto et al. |
| 8,324,621 B2 | 12/2012 | Yamazaki et al. |
| 8,415,665 B2 | 4/2013 | Kimura et al. |
| 8,441,425 B2 | 5/2013 | Ishitani et al. |
| 8,461,582 B2 | 6/2013 | Kimura |
| 8,466,463 B2 | 6/2013 | Akimoto et al. |
| 8,476,625 B2 | 7/2013 | Kimura |
| 8,519,395 B2 | 8/2013 | Kwon et al. |
| 8,629,069 B2 | 1/2014 | Akimoto et al. |
| 8,669,550 B2 | 3/2014 | Akimoto et al. |
| 8,686,426 B2 | 4/2014 | Ahn et al. |
| 8,742,422 B2 | 6/2014 | Sakakura et al. |
| 8,759,206 B2 | 6/2014 | Kimura |
| 8,790,959 B2 | 7/2014 | Akimoto et al. |
| 8,796,069 B2 | 8/2014 | Akimoto et al. |
| 8,877,569 B2 | 11/2014 | Oikawa et al. |
| 8,890,146 B2 | 11/2014 | Kimura et al. |
| 8,937,307 B2 | 1/2015 | Yamazaki |
| 8,999,750 B2 | 4/2015 | Kimura |
| 9,018,624 B2 | 4/2015 | Yamazaki |
| 9,041,202 B2 | 5/2015 | Kimura |
| 9,041,453 B2 | 5/2015 | Miyake et al. |
| 9,087,726 B2 | 7/2015 | Sato et al. |
| 9,093,542 B2 | 7/2015 | Maeda et al. |
| 9,099,562 B2 | 8/2015 | Akimoto et al. |
| 9,171,868 B2 | 10/2015 | Kimura et al. |
| 9,184,245 B2 | 11/2015 | Yamazaki |
| 9,201,280 B2 | 12/2015 | Kimura |
| 9,219,165 B2 | 12/2015 | Sato et al. |
| 9,269,728 B2 | 2/2016 | Yamazaki |
| 9,349,757 B2 | 5/2016 | Kimura et al. |
| 9,368,516 B2 | 6/2016 | Yamazaki |
| 9,379,248 B2 | 6/2016 | Maeda et al. |
| 9,397,255 B2 | 7/2016 | Kimura |
| 9,431,427 B2 | 8/2016 | Oikawa et al. |
| 9,449,819 B2 | 9/2016 | Sato et al. |
| 9,478,187 B2 | 10/2016 | Miyake et al. |
| 9,496,292 B2 | 11/2016 | Miyake et al. |
| 9,553,201 B2 | 1/2017 | Ahn et al. |
| 9,601,516 B2 | 3/2017 | Sakakura et al. |
| 9,711,537 B2 | 7/2017 | Yamazaki |
| 9,735,180 B2 | 8/2017 | Kimura et al. |
| 9,812,583 B2 | 11/2017 | Sato et al. |
| 9,857,651 B2 | 1/2018 | Zeng |
| 9,941,393 B2 | 4/2018 | Kimura |
| 9,978,329 B2 | 5/2018 | Miyake et al. |
| 10,002,888 B2 | 6/2018 | Kimura et al. |
| 10,008,608 B2 | 6/2018 | Ishitani et al. |
| 10,134,770 B2 | 11/2018 | Lin et al. |
| 10,312,267 B2 | 6/2019 | Kimura et al. |
| 10,326,008 B2 | 6/2019 | Kimura |
| 10,361,318 B2 | 7/2019 | Sato et al. |
| 10,424,674 B2 | 9/2019 | Ishitani et al. |
| 10,446,668 B2 | 10/2019 | Yamazaki |
| 10,580,797 B2 | 3/2020 | Kimura |
| 10,600,818 B2 | 3/2020 | Kimura et al. |
| 10,686,061 B2 | 6/2020 | Kimura |
| 10,854,641 B2 | 12/2020 | Kimura et al. |
| 10,886,413 B2 | 1/2021 | Sato et al. |
| 10,985,282 B2 | 4/2021 | Ishitani et al. |
| 11,133,332 B2 | 9/2021 | Kimura |
| 11,710,794 B2 | 7/2023 | Sato et al. |
| 11,869,978 B2 | 1/2024 | Ishitani et al. |
| 2003/0222838 A1 | 12/2003 | Iida et al. |
| 2004/0257519 A1 | 12/2004 | Jun et al. |
| 2007/0215945 A1 | 9/2007 | Tokunaga et al. |
| 2008/0002084 A1 | 1/2008 | Park et al. |
| 2008/0308805 A1 | 12/2008 | Akimoto et al. |
| 2011/0104851 A1 | 5/2011 | Akimoto et al. |
| 2011/0121290 A1 | 5/2011 | Akimoto et al. |
| 2013/0093658 A1 | 4/2013 | Park et al. |
| 2013/0157393 A1* | 6/2013 | Kimura .................... H01L 33/02 438/23 |
| 2014/0042436 A1* | 2/2014 | Yamazaki ............. H01L 29/267 257/43 |
| 2014/0138674 A1* | 5/2014 | Sato ..................... H01L 29/0657 257/43 |
| 2015/0016103 A1 | 1/2015 | Peng |
| 2015/0340513 A1 | 11/2015 | Akimoto et al. |
| 2016/0033819 A1 | 2/2016 | Li et al. |
| 2016/0064525 A1 | 3/2016 | Yamazaki |
| 2016/0315201 A1 | 10/2016 | Lee et al. |
| 2016/0343740 A1* | 11/2016 | Oikawa ................. H01L 27/124 |
| 2017/0148819 A1 | 5/2017 | Lin et al. |
| 2017/0186774 A1 | 6/2017 | Sakakura et al. |
| 2017/0301699 A1 | 10/2017 | Yamazaki et al. |
| 2017/0330902 A1 | 11/2017 | Kimura |
| 2018/0151654 A1 | 5/2018 | Lee |
| 2021/0020785 A1 | 1/2021 | Sato et al. |
| 2021/0074833 A1 | 3/2021 | Kimura |
| 2021/0210511 A1 | 7/2021 | Kimura et al. |
| 2021/0265505 A1 | 8/2021 | Ishitani et al. |
| 2022/0005840 A1 | 1/2022 | Kimura |
| 2022/0416060 A1 | 12/2022 | Kimura |
| 2023/0317857 A1 | 10/2023 | Sato et al. |

FOREIGN PATENT DOCUMENTS

| | | |
|---|---|---|
| CN | 104992925 A | 10/2015 |
| CN | 105388674 A | 3/2016 |
| CN | 106066552 A | 11/2016 |
| EP | 2192437 A | 6/2010 |
| EP | 2648221 A | 10/2013 |
| EP | 3324427 A | 5/2018 |
| JP | 2003-344824 A | 12/2003 |
| JP | 2006-186319 A | 7/2006 |
| JP | 2007-096055 A | 4/2007 |

(56) References Cited

FOREIGN PATENT DOCUMENTS

| | | |
|---|---|---|
| JP | 2007-123861 A | 5/2007 |
| JP | 2008-176262 A | 7/2008 |
| JP | 2010-156963 A | 7/2010 |
| JP | 2010-177223 A | 8/2010 |
| JP | 2010-206187 A | 9/2010 |
| JP | 2011-029304 A | 2/2011 |
| JP | 2011-077513 A | 4/2011 |
| JP | 2011-103452 A | 5/2011 |
| JP | 2011-141543 A | 7/2011 |
| JP | 2012-093707 A | 5/2012 |
| JP | 2013-214701 A | 10/2013 |
| JP | 2013-236126 A | 11/2013 |
| JP | 2013-258358 A | 12/2013 |
| JP | 2014-057052 A | 3/2014 |
| JP | 2014-075581 A | 4/2014 |
| JP | 2014-116588 A | 6/2014 |
| JP | 2014-211621 A | 11/2014 |
| KR | 2005-0041544 A | 5/2005 |
| KR | 2009-0119705 A | 11/2009 |
| KR | 2010-0100671 A | 9/2010 |
| KR | 2013-0054772 A | 5/2013 |
| KR | 2013-0140897 A | 12/2013 |
| WO | WO-2006/051994 | 5/2006 |
| WO | WO-2011/046003 | 4/2011 |
| WO | WO-2011/070929 | 6/2011 |

OTHER PUBLICATIONS

Chinese Office Action (Application No. 201711231700.1) Dated Aug. 20, 2021.

* cited by examiner

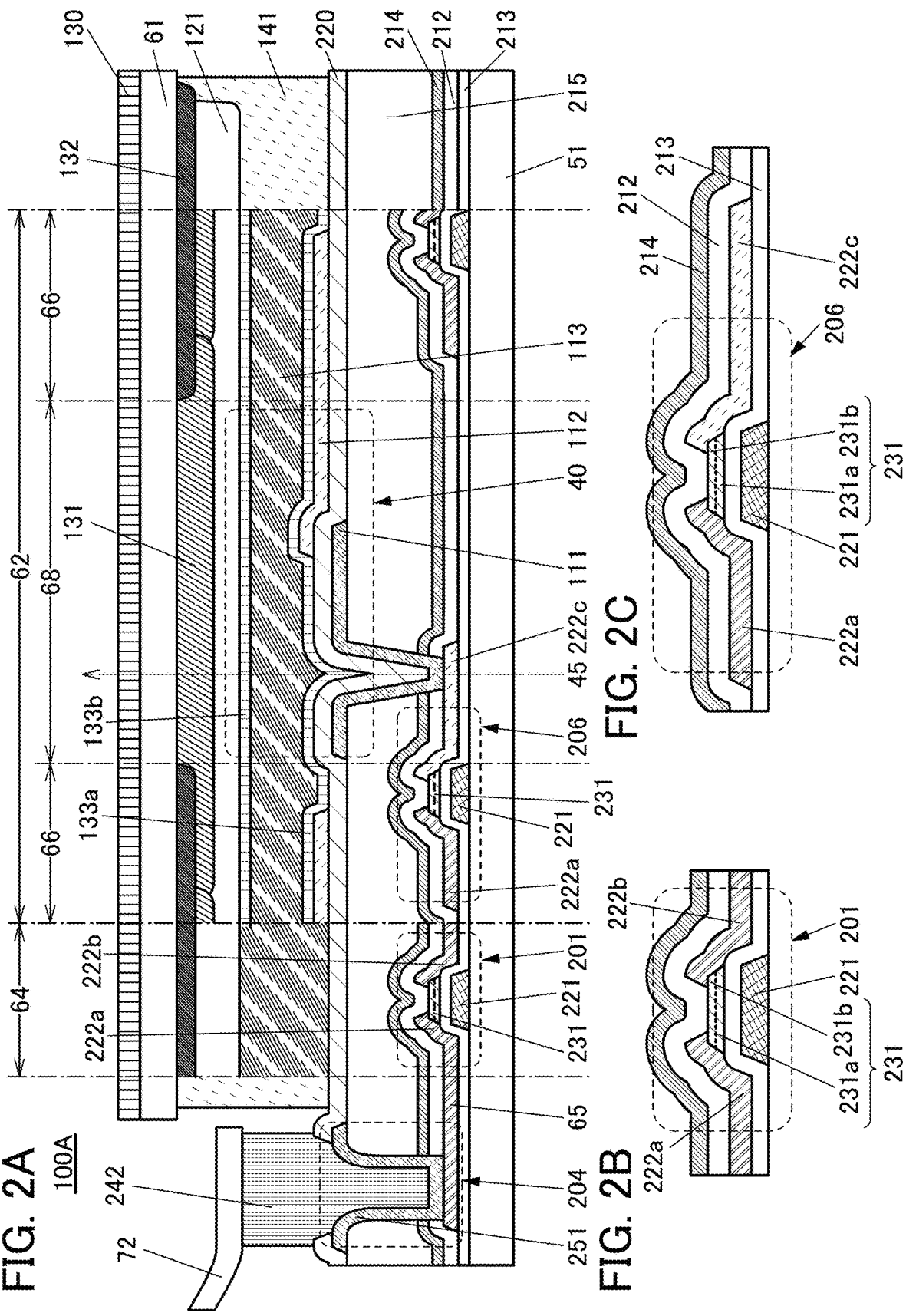

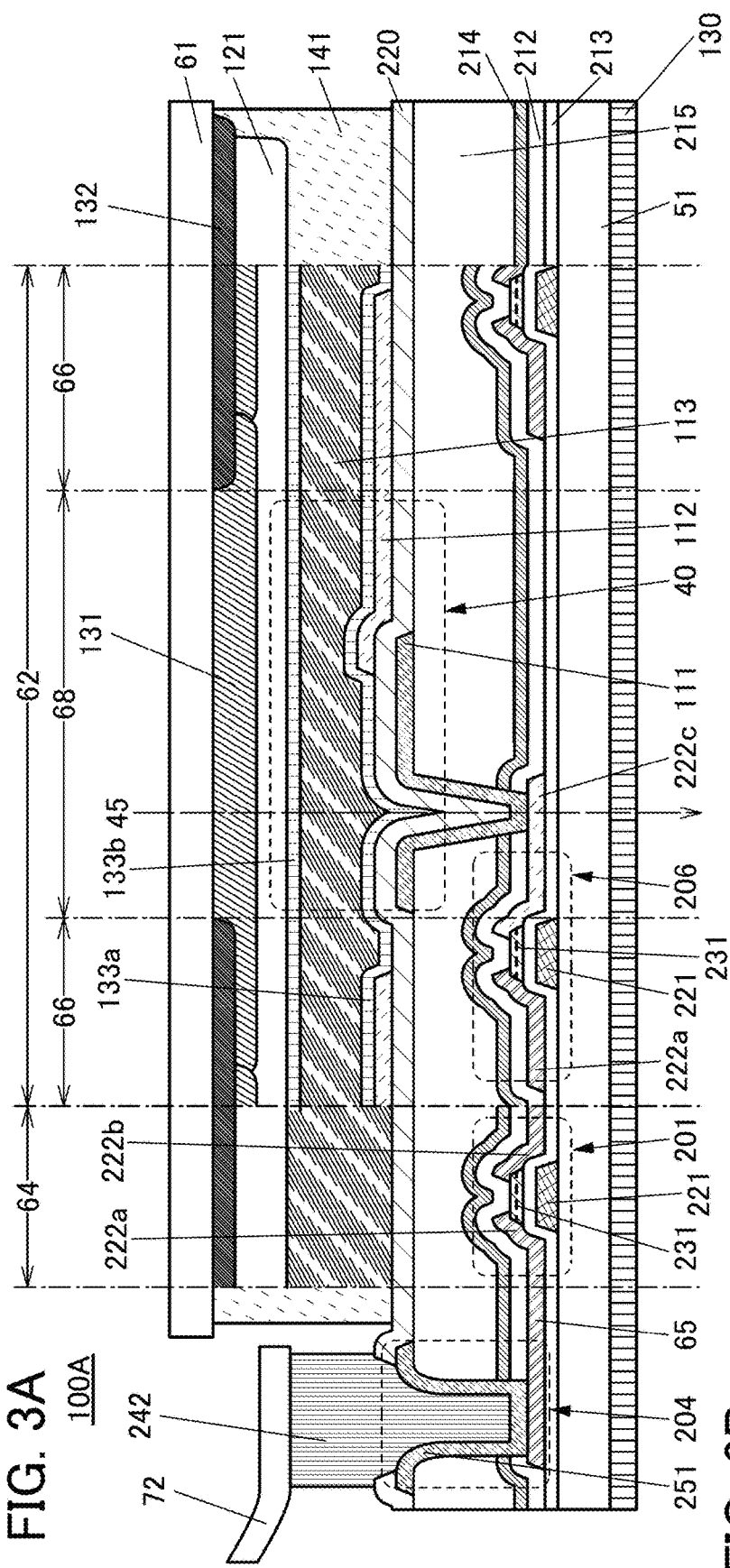
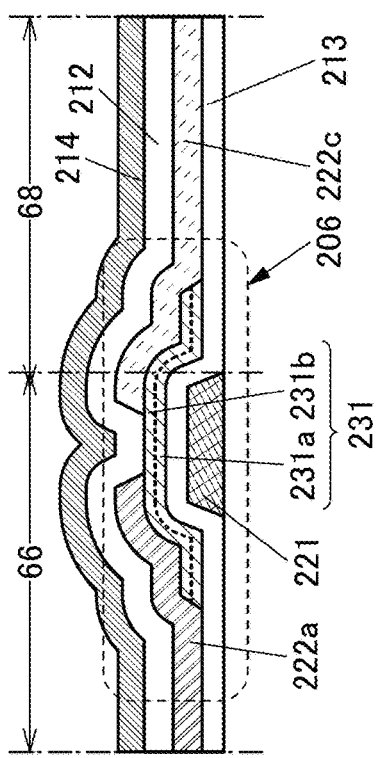
FIG. 3A
FIG. 3B

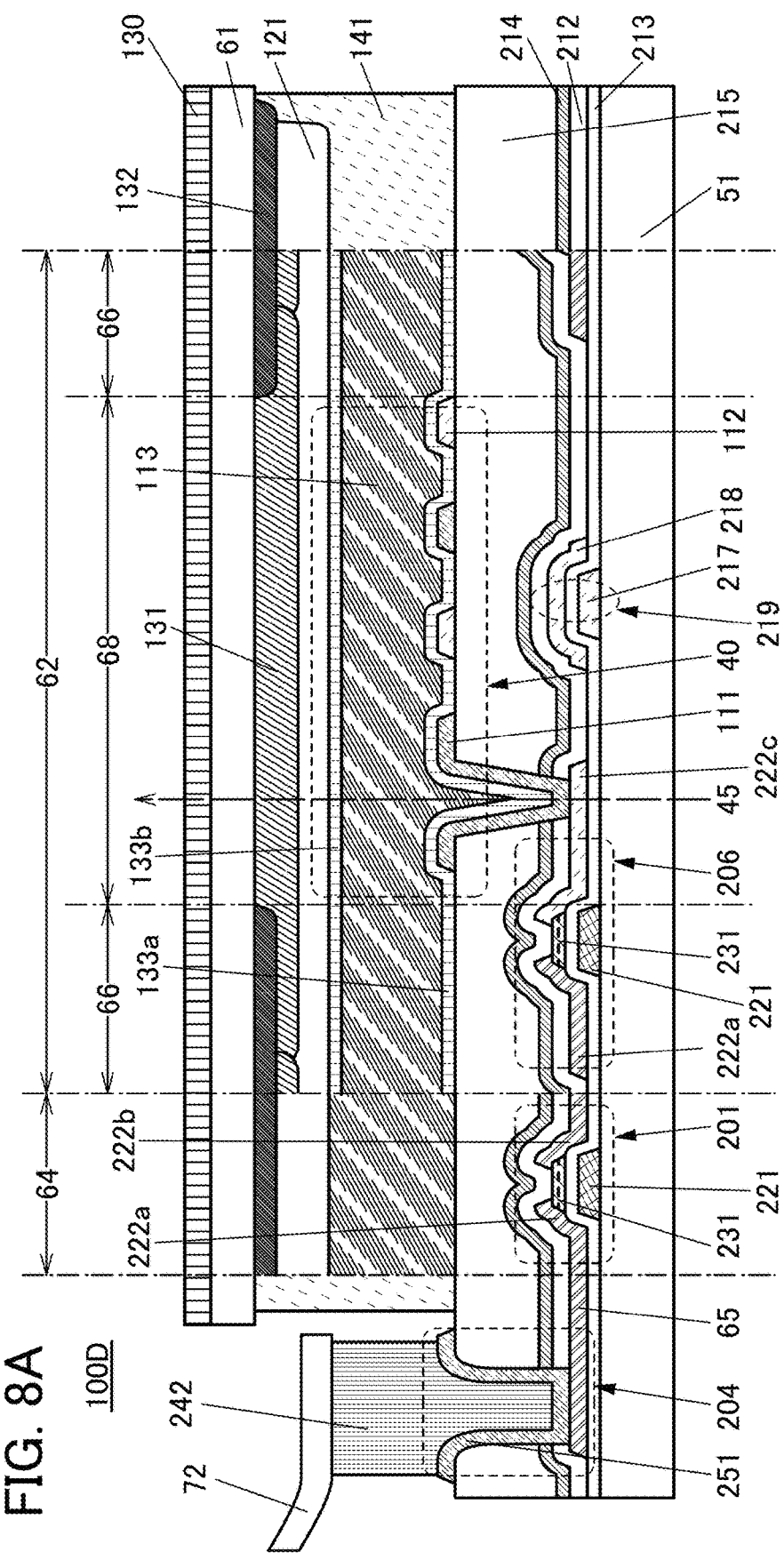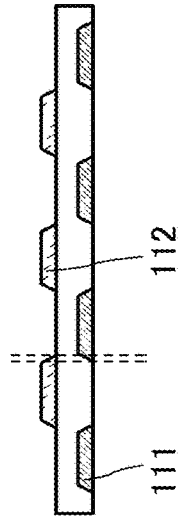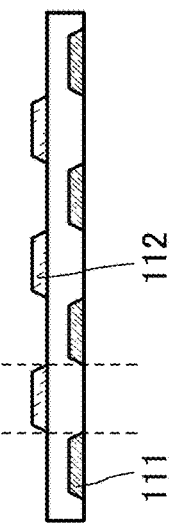

FIG. 11A
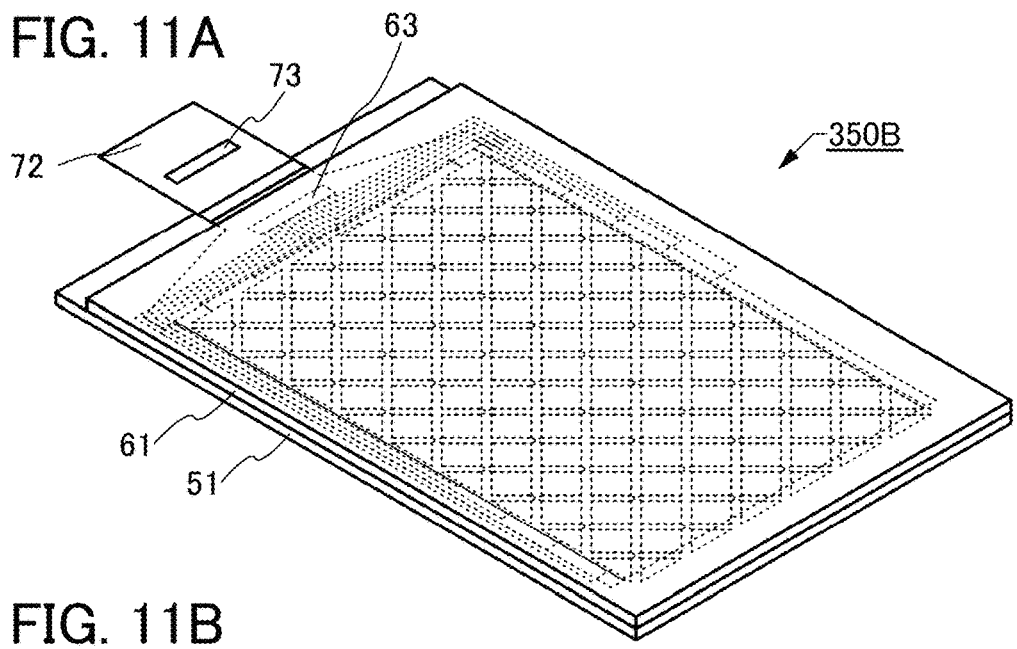
FIG. 11B
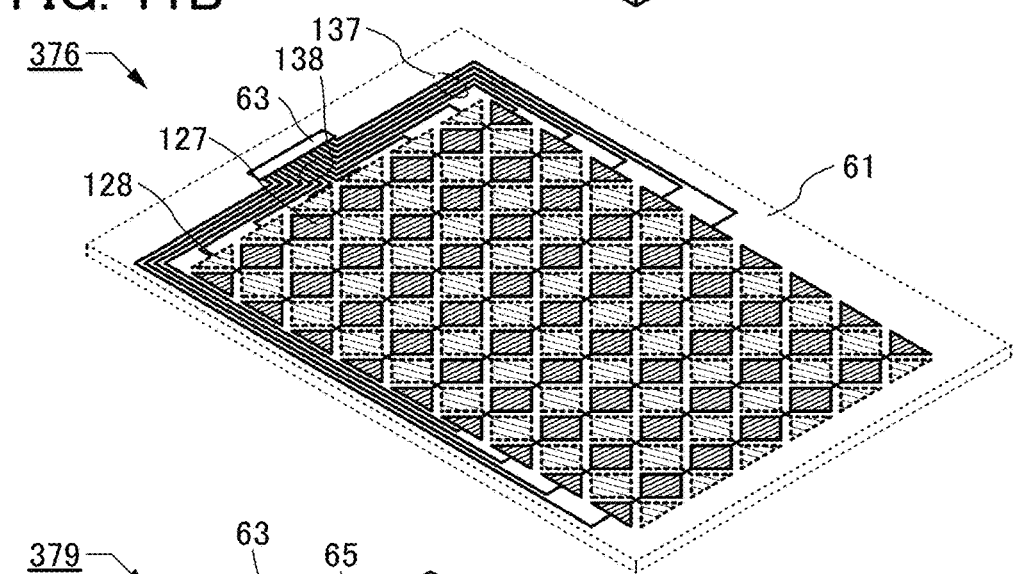
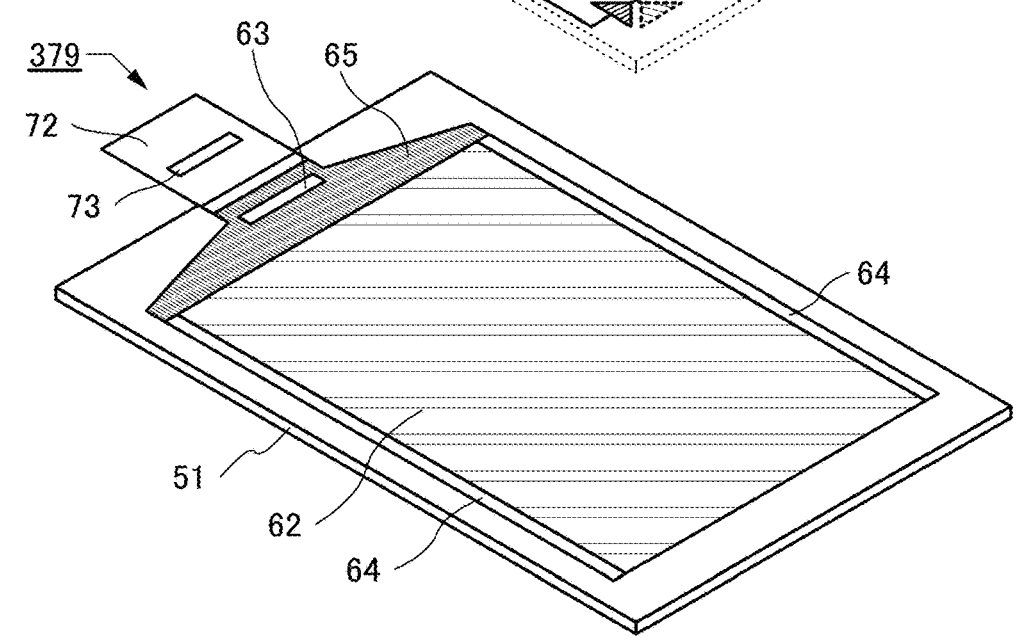

FIG. 21A1
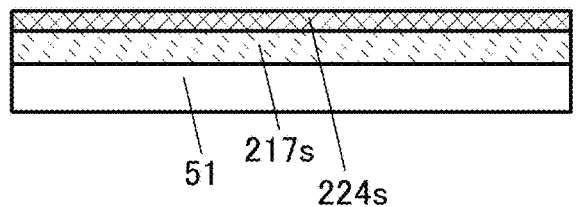
FIG. 21A2
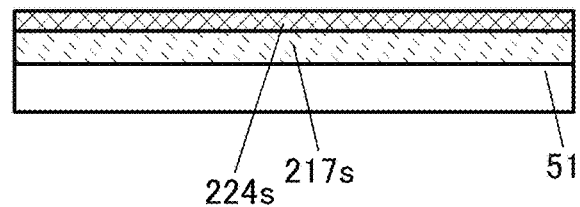
FIG. 21B1
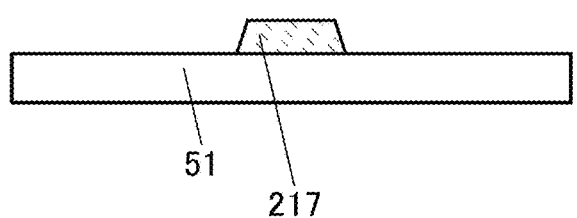
FIG. 21B2
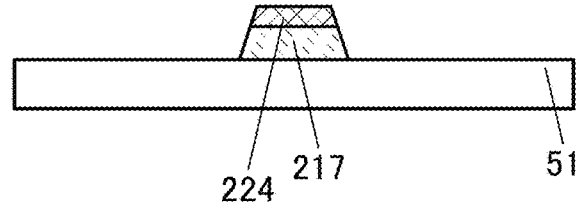
FIG. 21C1
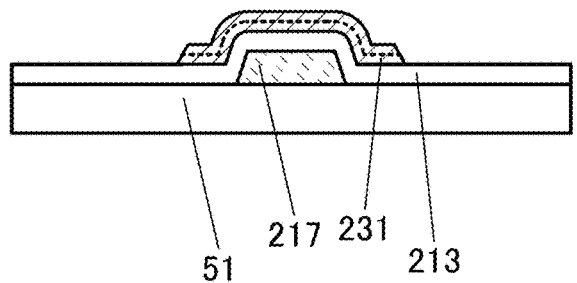
FIG. 21C2
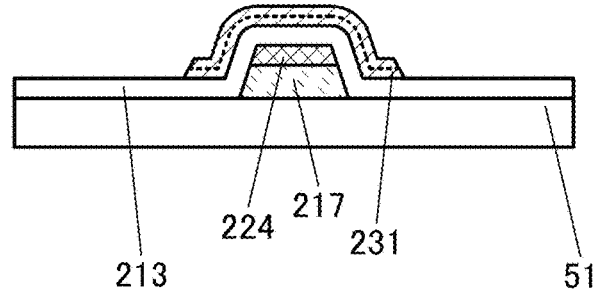

FIG. 22A1
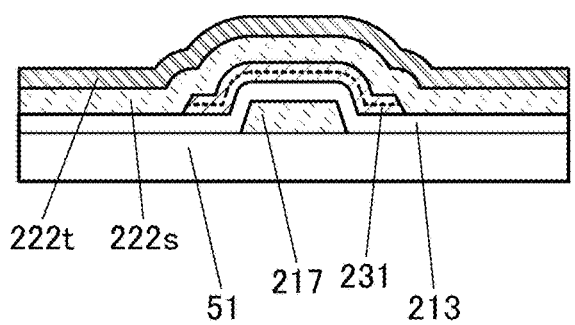
FIG. 22A2
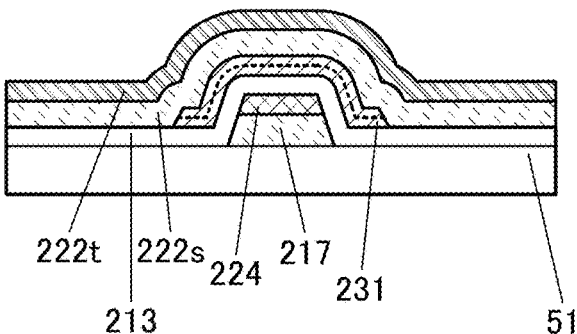
FIG. 22B1
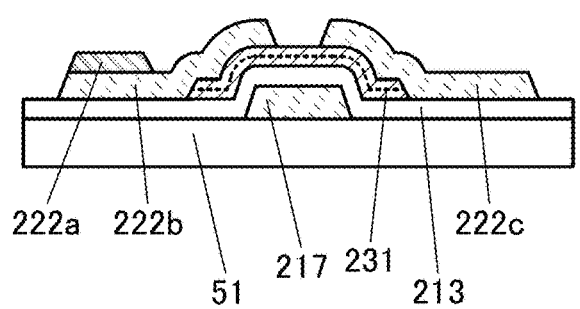
FIG. 22B2
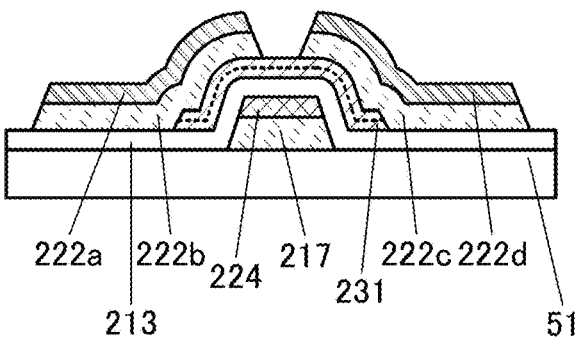
FIG. 22C1
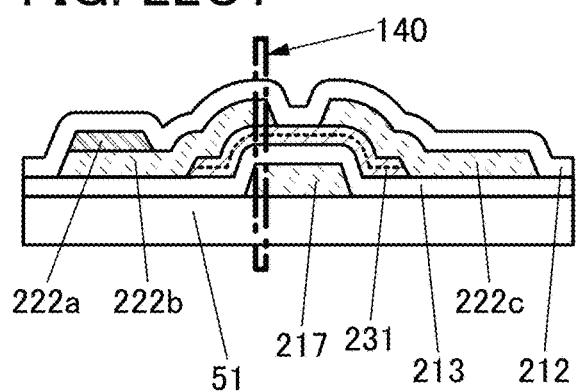
FIG. 22C2
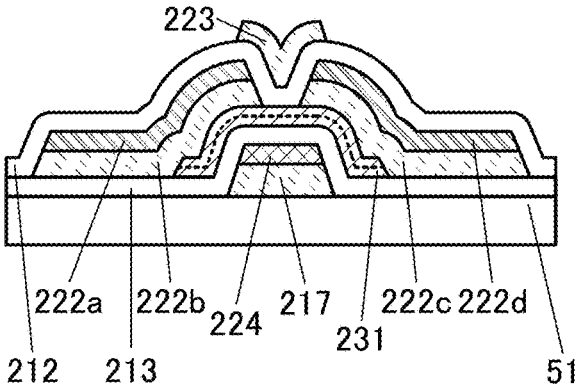
FIG. 22D1
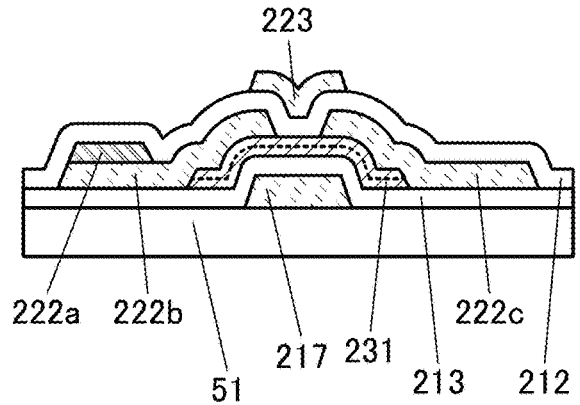
FIG. 22D2
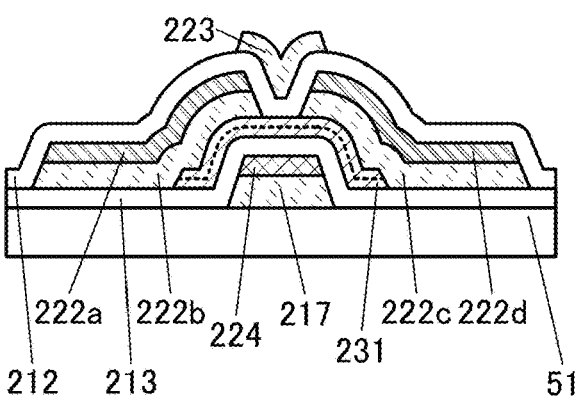

DISPLAY DEVICE, DISPLAY MODULE, AND ELECTRONIC DEVICE

CROSS-REFERENCE TO RELATED APPLICATIONS

This application is a continuation of U.S. application Ser. No. 17/944,275, filed Sep. 14, 2022, now allowed, which is a continuation of U.S. application Ser. No. 16/999,237, filed Aug. 21, 2020, now U.S. Pat. No. 11,456,320, which is a continuation of U.S. application Ser. No. 15/820,965, filed Nov. 22, 2017, now U.S. Pat. No. 10,756,118, which claims the benefit of foreign priority applications filed in Japan as Serial No. 2016-233560 on Nov. 30, 2016, and Serial No. 2017-099002 on May 18, 2017, all of which are incorporated by reference.

BACKGROUND OF THE INVENTION

1. Field of the Invention

One embodiment of the present invention relates to a liquid crystal display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor. For example, in Patent Documents 1 and 2, a technique is disclosed in which a transistor is manufactured using zinc oxide or an In—Ga—Zn-based oxide as an oxide semiconductor and the transistor is used as a switching element or the like of a pixel of a display device.

REFERENCE

Patent Documents

[Patent Document 1] Japanese Published Patent Application No. 2007-123861

[Patent Document 2] Japanese Published Patent Application No. 2007-096055

SUMMARY OF THE INVENTION

One object of one embodiment of the present invention is to provide a liquid crystal display device with a high aperture ratio. One object of one embodiment of the present invention is to provide a liquid crystal display device with low power consumption. One object of one embodiment of the present invention is to provide a high-definition liquid crystal display device. One object of one embodiment of the present invention is to provide a highly reliable liquid crystal display device.

Note that the description of these objects does not disturb the existence of other objects. One embodiment of the present invention does not necessarily achieve all the objects. Other objects can be derived from the description of the specification, the drawings, and the claims. One embodiment of the present invention is a display device including a liquid crystal element, a transistor, a scan line, and a signal line. The liquid crystal element includes a pixel electrode, a liquid crystal layer, and a common electrode. The scan line and the signal line are each electrically connected to the transistor. The scan line and the signal line each include a metal layer. The transistor is electrically connected to the pixel electrode. A semiconductor layer of the transistor includes a stack of a first metal oxide layer and a second metal oxide layer. The first metal oxide layer includes a region with lower crystallinity than the second metal oxide layer. The transistor includes a first region connected to the pixel electrode. The pixel electrode, the common electrode, and the first region are each configured to transmit visible light. Visible light passes through the first region and the liquid crystal element and exits from the display device.

One embodiment of the present invention is a display device including a liquid crystal element, a transistor, a scan line, and a signal line. The liquid crystal element includes a pixel electrode, a liquid crystal layer, and a common electrode. The scan line and the signal line are each electrically connected to the transistor. The scan line and the signal line each include a metal layer. The transistor is electrically connected to the pixel electrode. The transistor includes a gate electrode, an insulating layer over the gate electrode, a semiconductor layer over the insulating layer, and a pair of electrodes over the semiconductor layer. The semiconductor layer includes a first metal oxide layer and a second metal oxide layer over the first metal oxide layer. The first metal oxide layer includes a region with lower crystallinity than the second metal oxide layer. The transistor includes a first region connected to the pixel electrode. The pixel electrode, the common electrode, and the first region are each configured to transmit visible light. Visible light passes through the first region and the liquid crystal element and exits from the display device.

It is preferable that the first metal oxide layer and the second metal oxide layer each independently include indium, metal M (M represents aluminum, gallium, yttrium, or tin), and zinc. For example, an atomic ratio of the indium to the metal M and the zinc is 4:x:y, where x is greater than or equal to 1.5 and less than or equal to 2.5 and y is greater than or equal to 2 and less than or equal to 4. For example, an atomic ratio of the indium to the metal M and the zinc is 5:x:y, where x is greater than or equal to 0.5 and less than or equal to 1.5 and y is greater than or equal to 5 and less than or equal to 7.

It is preferable that the second metal oxide layer include a crystal part having c-axis alignment.

The display device with the above-described structure may further include a touch sensor. The touch sensor is closer to a display surface than the liquid crystal element and the transistor are.

It is preferable that the scan line include a portion overlapping with the semiconductor layer.

Visible light may pass through the first region and the liquid crystal element in the order presented and exit from the display device. Alternatively, visible light may pass through the liquid crystal element and the first region in the order presented and exit from the display device.

It is preferable that a direction in which the scan line extends intersect with a direction in which the signal line extends. It is preferable that a direction in which a plurality of pixels exhibiting the same color are aligned intersect with a direction in which the signal line extends. One embodiment of the present invention is a display module that includes a display device with one of the structures described above. The display module has a connector such as flexible printed circuit (FPC) board or a tape carrier package (TCP) connected thereto, or an IC is implemented on the display module with a method such as a chip on glass (COG) method or a chip on film (COF) method.

One embodiment of the present invention is an electronic device including the above-described display module and at least one of an antenna, a battery, a housing, a camera, a speaker, a microphone, and an operation button.

One embodiment of the present invention can provide a liquid crystal display device with high aperture ratio. One embodiment of the present invention can provide a liquid crystal display device with low power consumption. One embodiment of the present invention can provide a high-definition liquid crystal display device. One embodiment of the present invention can provide a highly reliable liquid crystal display device.

Note that the description of these effects does not disturb the existence of other effects. One embodiment of the present invention does not necessarily have all the effects. Other effects can be derived from the description of the specification, the drawings, and the claims.

BRIEF DESCRIPTION OF THE DRAWINGS

FIGS. 2A to 2C are cross-sectional views showing an example of a display device.

FIGS. 3A and 3B are cross-sectional views showing examples of a display device.

FIGS. 8A to 8D are cross-sectional view showing examples of a display device.

FIGS. 11A and 11B are perspective views showing an example of a display device.

FIGS. 21A1, 21A2, 21B1, 21B2, 21C1, and 21C2 show a manufacturing method of a display device of Example 2.

FIGS. 22A1, 22A2, 22B1, 22B2, 22C1, 22C2, 22D1, and 22D2 show a manufacturing method of a display device of Example 2.

DETAILED DESCRIPTION OF THE INVENTION

Figure 1:
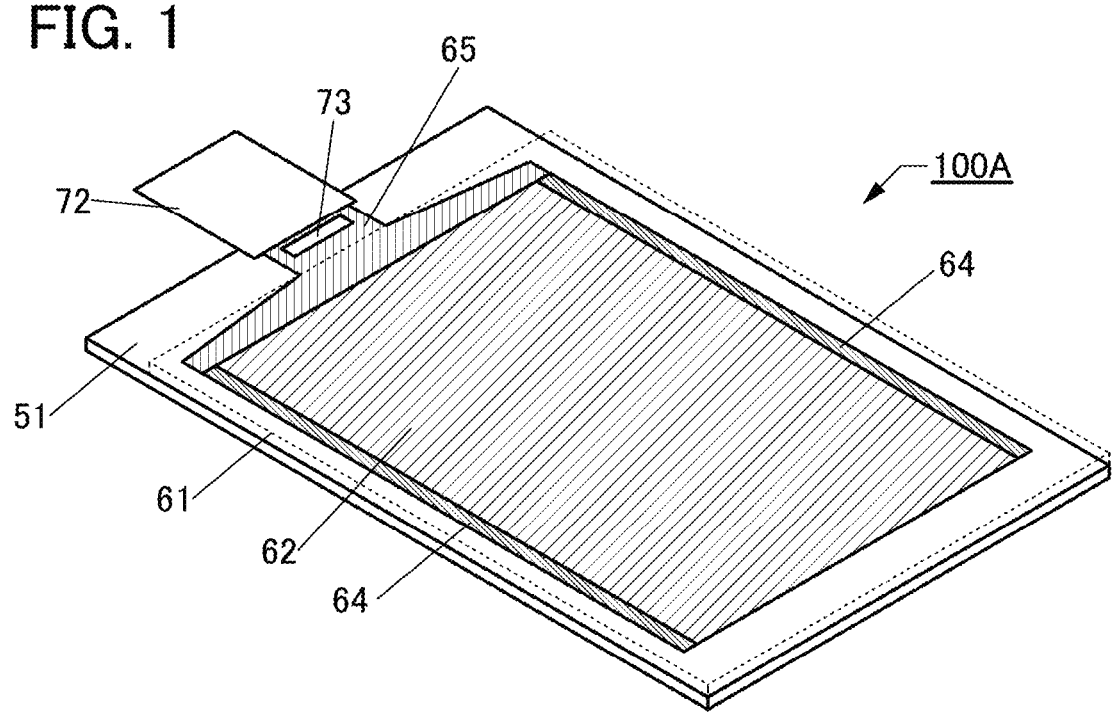
FIG. 1 is a perspective view illustrating an example of a display device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a display device of one embodiment of the present invention is described with reference to FIG. 1, FIGS. 2A to 2C, FIGS. 3A and 3B, FIGS. 4A and 4B, FIGS. 5A and 5B, FIG. 6, FIG. 7, FIGS. 8A to 8D, FIGS. 9A and 9B, FIGS. 10A and 10B, and FIGS. 11A and 11B.

1. Structure Example 1 of Display Device

First, a display device of this embodiment is described with reference to FIG. 1, FIGS. 2A to 2C, FIGS. 3A and 3B, FIGS. 4A and 4B, and FIGS. 5A and 5B.

A display device of this embodiment includes a liquid crystal element and a transistor. The liquid crystal element includes a pixel electrode, a liquid crystal layer, and a common electrode. The transistor is electrically connected to the pixel electrode. A semiconductor layer of the transistor includes a stack of a first metal oxide layer and a second metal oxide layer. The first metal oxide layer includes a region with lower crystallinity than the second metal oxide layer. The transistor includes a first region connected to the pixel electrode. The pixel electrode, the common electrode, and the first region each have a function of transmitting visible light. Visible light passes through the first region and the liquid crystal element and exits from the display device.

A display device of this embodiment includes a liquid crystal element and a transistor. The liquid crystal element includes a pixel electrode, a liquid crystal layer, and a common electrode. The transistor is electrically connected to the pixel electrode. The transistor includes a gate electrode, an insulating layer over the gate electrode, a semiconductor layer over the insulating layer, and a pair of electrodes over the semiconductor layer. The semiconductor layer includes a first metal oxide layer and a second metal oxide layer over the first metal oxide layer. The first metal oxide layer includes a region with lower crystallinity than the second metal oxide layer. The transistor includes a first region connected to the pixel electrode. The pixel electrode, the common electrode, and the first region each have a function of transmitting visible light. Visible light passes through the first region and the liquid crystal element and exits from the display device.

In the display device of this embodiment, a contact portion where the transistor and the pixel electrode are in contact with each other can be provided in a display region because the contact portion transmits visible light. Thus, the aperture ratio of the pixel can be increased. The higher the aperture ratio is, the more the light extraction efficiency can be increased. When the light extraction efficiency can be increased, the luminance of a backlight unit can be decreased. Therefore, the power consumption of the display device can be reduced. Moreover, a high-definition display device can be obtained.

The display device of this embodiment further includes a scan line and a signal line. The scan line and the signal line are each electrically connected to the transistor. The scan line and the signal line each include a metal layer. The scan line and the signal line each including the metal layer can have reduced resistance.

The scan line preferably includes a portion overlapping with a channel region of the transistor. When a channel region of a transistor is irradiated with light, the characteristics of the transistor are changed in some cases depending on a material of the channel region of the transistor. In the case where the portion of the scan line overlaps with the channel region of the transistor, the irradiation of the channel region with external light, light of a backlight, or the like can be suppressed. Thus, the reliability of the transistor can be improved. One conductive film may function as a scan line and a gate (or a back gate).

In one embodiment of the present invention, the transistor, a wiring, a capacitor, and the like can be formed using a light-transmitting semiconductor material and a light-transmitting conductive material described below.

A semiconductor film in the transistor can be formed with a light-transmitting semiconductor material. Examples of the light-transmitting semiconductor material include a metal oxide and an oxide semiconductor (OS). An oxide semiconductor preferably contains at least indium (In). In particular, indium (In) and zinc (Zn) are preferably contained. In addition, one or more of aluminum (Al), gallium (G), yttrium (Y), tin (Sn), copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

A conductive film in the transistor can be formed with a light-transmitting conductive material. The light-transmitting conductive material preferably contains one or more kinds of indium, zinc, and tin. Specifically, an In oxide, an In—Sn oxide (also referred to as an indium tin oxide or ITO), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

The conductive film of the transistor may be an oxide semiconductor that includes an impurity element and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has an increased conductivity and becomes a conductor.

An oxide semiconductor has a large energy gap (e.g., an energy gap of 2.5 eV or larger), and thus has a visible light transmitting property. An oxide conductor is an oxide semiconductor having a donor level in the vicinity of the conduction band as described above. Therefore, the influence of absorption due to the donor level is small in an oxide conductor, and an oxide conductor has a visible light transmitting property comparable to that of an oxide semiconductor.

The oxide conductor preferably includes one or more kinds of metal elements included in the semiconductor film of the transistor. When two or more layers included in the transistor are formed using the oxide semiconductors including the same metal element, the same manufacturing apparatus (e.g., deposition apparatus or processing apparatus) can be used in two or more steps and manufacturing cost can thus be reduced.

FIG. 1 is a perspective view of a display device 100A. For clarity, components such as a polarizer 130 are not drawn in FIG. 1. FIG. 1 illustrates a substrate 61 with the dotted line. FIG. 2A and FIG. 3A are cross-sectional views of the display device 100A. FIG. 2B is an enlarged view of a transistor 201 included in the display device 100A. FIG. 2C is an enlarged view of a transistor 206 included in the display device 100A. FIG. 3B is a modification example of the transistor 206 included in the display device 100A.

The display device 100A includes a display portion 62 and a driver circuit portion 64. An FPC 72 and an IC 73 are mounted on the display device 100A.

The display portion 62 includes a plurality of pixels and has a function of displaying images.

A pixel includes a plurality of subpixels. For example, the display portion 62 can display a full-color image by having one pixel be composed of three subpixels: a subpixel exhibiting a red color, a subpixel exhibiting a green color, and a subpixel exhibiting a blue color. Note that the color exhibited by subpixels is not limited to red, green, and blue. A pixel may be composed of subpixels that exhibit colors of white, yellow, magenta, or cyan, for example In this specification and the like, a subpixel may be simply described as a pixel.

The display device 100A may include one or both of a scan line driver circuit and a signal line driver circuit. The display device 100A may include none of the scan line driver circuit and the signal line driver circuit. When the display device 100A includes a sensor such as a touch sensor, the display device 100A may include a sensor driver circuit. In this embodiment, the driver circuit portion 64 is exemplified as including the scan line driver circuit. The scan line driver circuit has a function of outputting a scan signal to the scan line included in the display portion 62.

In the display device 100A, the IC 73 is mounted on a substrate 51 by a COG method or the like. The IC 73 includes, for example, any one or more of a signal line driver circuit, a scan line driver circuit, and a sensor driver circuit.

The FPC 72 is electrically connected to the display device 100A. The IC 73 and the driver circuit portion 64 are supplied with signals or power from the outside through the FPC 72. Furthermore, signals can be output to the outside from the IC 73 through the FPC 72.

An IC may be mounted on the FPC 72. For example, an IC including any one or more of a signal line driver circuit, a scan line driver circuit, and a sensor driver circuit may be mounted on the FPC 72.

A wiring 65 supplies signals and power to the display portion 62 and the driver circuit portion 64. The signals and power are input to the wiring 65 from the outside through the FPC 72, or from the IC 73.

FIG. 2A and FIG. 3A are cross-sectional views including the display portion 62, the driver circuit portion 64, and the wiring 65. In FIG. 2A and the subsequent cross-sectional views of the display device, the display portion 62 includes a display region 68 in a subpixel and a non-display region 66 around the display region 68.

In the example shown in FIG. 2A, the polarizer 130 is positioned on the substrate 61 side, and a backlight unit (not shown) is positioned on the substrate 51 side. Light 45 emitted from the backlight unit enters the substrate 51, passes through a contact portion where the transistor 206 and a pixel electrode 111 are in contact with each other, a liquid crystal element 40, a coloring layer 131, the substrate 61, and the polarizer 130 in the order presented, and exits from the display device 100A.

In the example shown in FIG. 3A, the polarizer 130 is positioned on the substrate 51 side, and the backlight unit (not shown) is positioned on the substrate 61 side. The light 45 emitted from the backlight unit enters the substrate 61, passes through the coloring layer 131, the liquid crystal element 40, the contact portion where the substrate 206 and the pixel electrode 111 are in contact with each other, the substrate 51, and the polarizer 130 in the order presented, and exits from the display device 100A.

As described above, in the display device of this embodiment, either a surface on the substrate 51 side or a surface on the substrate 61 side can be used as the display surface without changing the structure existing between the substrate 51 and the substrate 61. The determination of the display surface can be made as appropriate depending on the position of the backlight unit, the polarizer, the touch sensor, or the like.

Although the following description is made using FIG. 2A as an example, the following description can also apply to FIG. 3A.

The display device 100A is an example of a transmissive liquid crystal display device that includes a liquid crystal element with a horizontal electric field mode.

As illustrated in FIG. 2A, the display device 100A includes the substrate 51, the transistor 201, the transistor 206, the liquid crystal element 40, an alignment film 133$a$, an alignment film 133$b$, a connection portion 204, an adhesive layer 141, the coloring layer 131, a light-blocking layer 132, an overcoat 121, the substrate 61, the polarizer 130, and the like.

The transistor 206 is provided in the non-display region 66. FIG. 2C is an enlarged view of the transistor 206.

The transistor 206 includes a gate 221, an insulating layer 213, a conductive layer 222$a$, a conductive layer 222$c$, and a semiconductor layer 231.

The gate 221 overlaps with the semiconductor layer 231 with the insulating layer 213 positioned therebetween. The insulating layer 213 functions as a gate insulating layer. Each of the conductive layers 222$a$ and 222$c$ is connected to the semiconductor layer 231.

In FIG. 2A, the pixel electrode 111 included in the liquid crystal element 40 is electrically connected to the semiconductor layer 231 with the conductive layer 222$c$ positioned therebetween.

The conductive layer 222$c$ is formed using a material that transmits visible light. Thus, the contact portion where the pixel electrode 111 and the transistor are in contact with each other can be provided in the display region 68. Accordingly, the aperture ratio of the subpixel can be increased and the power consumption of the display device can be reduced.

As shown in FIG. 2C, the semiconductor layer 231 includes a first metal oxide layer 231$a$ and a second metal oxide layer 231$b$ over the first metal oxide layer 231$a$. The first metal oxide layer 231$a$ and the second metal oxide layer 231$b$ each preferably include In, M (M is Ga, Al, Y, or Sn), and Zn.

It is preferable that the first metal oxide layer 231$a$ and the second metal oxide layer 231$b$ each have a region where the atomic proportion of In is higher than the atomic proportion of M because the field-effect mobility of the transistor is increased in such a structure. For example, the atomic ratio of In to M and Zn in each of the first metal oxide layer 231$a$ and the second metal oxide layer 231$b$ is preferably In:M:Zn=4:2:3 or a neighborhood of InM:Zn=4:2:3, or In:M:Zn=5:1:7 or a neighborhood of In:M:Zn=5:1:7. The term "neighborhood" includes the following: when In is 4, M is greater than or equal to 1.5 and less than or equal to 2.5, and Zn is greater than or equal to 2 and less than or equal to 4. Also the term "neighborhood" includes the following: when In is 5, M is greater than or equal to 0.5 and less than or equal to 1.5, and Zn is greater than or equal to 5 and less than or equal to 7. When the compositions of the first metal oxide layer 231$a$ and the second metal oxide layer 231$b$ are substantially the same, they can be formed using the same sputtering target and the manufacturing cost can thus be reduced.

For the first metal oxide layer 231$a$ and the second metal oxide layer 231$b$, it is particularly preferable to use stacked films deposited successively without exposure to the air using targets with the same composition, although it is also possible to use films deposited using targets with different compositions. When the films are deposited successively, one deposition apparatus can be shared between a plurality of deposition steps, and remaining of impurities between the first metal oxide layer 231$a$ and the second metal oxide layer 231$b$ can be suppressed.

It is preferable that the second metal oxide layer 231b include a region having higher crystallinity than the first metal oxide layer 231a. Including such a high-crystallinity region, the second metal oxide layer 231b can have higher etching resistance than the first metal oxide layer 231a. Thus, it is possible to prevent the removal of the second metal oxide layer 231b due to etching when the conductive layer 222a and the conductive layer 222c are processed. As a result, a channel-etched transistor as illustrated in FIGS. 2A and 2B can be formed. Furthermore, when a high-crystallinity film is used for the second metal oxide layer 231b positioned on the back channel side of the transistor, the amount of impurities which may diffuse into the first metal oxide layer 231a positioned on the gate 221 side can be reduced. Thus, a transistor with high reliability can be obtained.

Furthermore, when the first metal oxide layer 231a includes a film including a region having lower crystallinity than the second metal oxide layer 231b, oxygen easily diffuses into the first metal oxide layer 231a, and the proportion of oxygen vacancy in the first metal oxide layer 231a can be reduced. In particular, the first metal oxide layer 231a is positioned close to the gate 221 and is a main layer where a channel is easily formed. Thus, when such a film is used for the first metal oxide layer 231a, a highly reliable transistor can be obtained.

The first metal oxide layer 231a and the second metal oxide layer 231b can be formed in different manners, for example, with different deposition conditions. For example, the oxygen gas flow rate in the deposition gas can be varied between the first metal oxide layer 231a and the second metal oxide layer 231b.

In this case, as the deposition condition of the first metal oxide layer 231a, the proportion of oxygen gas flow rate (also referred to as oxygen flow rate ratio) in a whole deposition gas is higher than or equal to 0% and lower than or equal to 30%, preferably higher than or equal to 5% and lower than or equal to 15%. With the above oxygen flow rate ratio, the first metal oxide layer 231a can have low crystallinity.

As the deposition condition of each of the second metal oxide layer 231b, the oxygen flow rate ratio is higher than 30% and lower than or equal to 100%, preferably higher than or equal to 50% and lower than or equal to 100%, further preferably higher than or equal to 70% and lower than or equal to 100%. With the above oxygen flow rate ratio, the second metal oxide layer 231b can have high crystallinity.

The substrate temperature at which the first metal oxide layer 231a and the second metal oxide layer 231b are formed is preferably higher than or equal to room temperature (25° C.) and lower than or equal to 200° C., further preferably higher than or equal to room temperature and lower than or equal to 130° C. The substrate temperature in the above range can prevent bending or warpage of the substrate in the case where the substrate is a large glass substrate. In the case where the first metal oxide layer 231a and the second metal oxide layer 231b are formed with the same substrate temperature, the productivity can be increased. In the case where the first metal oxide layer 231a and the second metal oxide layer 231b are formed with different substrate temperatures, for example, the substrate temperature in forming the second metal oxide layer 231b is higher than that in forming the first metal oxide layer 231a, the crystallinity of the second metal oxide layer 231b can be further increased.

For example, it is preferable that a cloud-aligned composite oxide semiconductor (CAC-OS) film be used for the first metal oxide layer 231a and a c-axis-aligned crystalline oxide semiconductor (CAAC-OS) film be used for the second metal oxide layer 231b.

A conductive layer used as the gate 221 may also function as a scan line. That is, one conductive layer may function as a scan line and the gate 221. A conductive layer used as the conductive layer 222a may also function as a signal line. That is, one conductive layer may function as a signal line and the conductive layer 222a. It is preferable that the resistance of the conductive layer functioning as a scan line or a signal line be sufficiently low. Therefore, it is preferable that the conductive layer functioning as a scan line or a signal line be formed using a metal, an alloy, or the like. The conductive layer functioning as a scan line or a signal line may be formed using a material having a function of blocking visible light.

Specifically, in some cases, a conductive material that transmits visible light has higher resistivity than a conductive material that blocks visible light, such as copper or aluminum. Thus, a conductive material (a metal material) that has low resistivity and blocks visible light is preferably used as a bus line such as a scan line or a signal line to prevent signal delay. Note that a conductive material that transmits visible light can be used for a bus line depending on the size of the pixel, the width of the bus line, the thickness of the bus line, or the like.

When the gate 221 is formed using a conductive layer that blocks visible light, irradiation of the semiconductor layer 231 with light emitted from the backlight can be suppressed. When a conductive layer that blocks visible light overlaps with the semiconductor layer 231 in this manner, the variation in the characteristics of the transistor due to light can be suppressed. Accordingly, the reliability of the transistor can be improved.

The light-blocking layer 132 is provided between the semiconductor layer 231 and the substrate 61, and the gate 221 that blocks visible light is provided between the semiconductor layer 231 and the substrate 51. This structure can suppress irradiation of the semiconductor layer 231 with external light and light emitted from the backlight.

The modification example of the transistor 206 is shown in FIG. 3B. In FIG. 3B, the semiconductor layer 231 of the transistor 206 is partly positioned in the display region 68. In the case where the semiconductor layer of the transistor is formed using silicon, typically amorphous silicon or low-temperature polysilicon, the semiconductor layer absorbs part of visible light; accordingly, it is difficult to extract light through the semiconductor layer. When an impurity such as phosphorus or boron is included in silicon, the light transmitting property is more decreased in some cases, and accordingly, it is more difficult to extract light through a low-resistance region formed in silicon in some cases. However, in one embodiment of the present invention, an oxide semiconductor (OS) and an oxide conductor (OC) each have a visible light transmitting property, so that the aperture ratio of the pixel or the subpixel can be increased.

The transistor 206 is covered by an insulating layer 212, an insulating layer 214, and an insulating layer 215. Note that the insulating layers 212 and 214 can be considered as the components of the transistor 206. The transistor is preferably covered by an insulating layer that reduces the diffusion of an impurity to the semiconductor constituting the transistor. The insulating layer 215 can function as a planarization layer.

Each of the insulating layers 212 and 213 preferably includes an excess oxygen region. When each of the insulating layers 212 and 213 includes an excess oxygen region, excess oxygen can be supplied to the semiconductor layer 231. A highly reliable transistor can be provided since oxygen vacancies that are potentially formed in the semiconductor layer 231 can be filled with excess oxygen.

It is preferable to use an oxide insulating film formed in an oxygen-containing atmosphere, such as a silicon oxide film or a silicon oxynitride film, for the insulating layer 212. An insulating film with low oxygen diffusibility and oxygen permeability, such as a silicon nitride film, is preferably stacked as the insulating layer 214 over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the semiconductor layer 231. As a result, oxygen vacancies in the semiconductor layer 231 can be filled and defects at the interface between the semiconductor layer 231 and the insulating layer 212 can be repaired, leading to a reduction in the density of defect states. Accordingly, an extremely highly reliable display device can be fabricated.

The liquid crystal element 40 is provided in the display region 68. The liquid crystal element 40 is a liquid crystal element using a fringe field switching (FFS) mode.

The liquid crystal element 40 includes the pixel electrode 111, a common electrode 112, and a liquid crystal layer 113. The alignment of the liquid crystal layer 113 can be controlled with the electrical field generated between the pixel electrode 111 and the common electrode 112. The liquid crystal layer 113 is positioned between the alignment films 133a and 133b.

The common electrode 112 may have a top-surface shape (also referred to as a planar shape) that has a comb-like shape or a top-surface shape that is provided with a slit. FIG. 2A and FIG. 3A illustrate an example in which one opening is provided in the common electrode 112 in the display region 68 of one subpixel. One opening or a plurality of openings can be provided in the common electrode 112. As the definition of the display device increases, the area of the display region 68 in one subpixel becomes smaller. Thus, the number of openings provided in the common electrode 112 is not limited to more than one; one opening can be provided. That is, in a high-definition display device, the area of the pixel (the subpixel) is small; therefore, an adequate electric field for the alignment of liquid crystals over the entire display region of the subpixel can be generated, even when there is only one opening in the common electrode 112.

An insulating layer 220 is provided between the pixel electrode 111 and the common electrode 112. The pixel electrode 111 includes a portion that overlaps with the common electrode 112 with the insulating layer 220 provided therebetween. Furthermore, the common electrode 112 is not placed over the pixel electrode 111 in some areas of a region where the pixel electrode 111 and the coloring layer 131 overlap.

An alignment film is preferably provided in contact with the liquid crystal layer 113. The alignment film can control the alignment of the liquid crystal layer 113. In the display device 100A, the alignment film 133a is positioned between the common electrode 112 (or the insulating layer 220) and the liquid crystal layer 113, and the alignment film 133b is positioned between the overcoat 121 and the liquid crystal layer 113.

The liquid crystal material is classified into a positive liquid crystal material with a positive dielectric anisotropy (Δε) and a negative liquid crystal material with a negative dielectric anisotropy. Both of the materials can be used in one embodiment of the present invention, and an optimal liquid crystal material can be selected according to the employed mode and design.

In one embodiment of the present invention, a negative liquid crystal material is preferably used. The negative liquid crystal is less affected by a flexoelectric effect and thus the polarity of voltage applied to the liquid crystal layer makes little difference in light transmittance. This prevents flickering from being recognized by the user of the display device. The flexoelectric effect is a phenomenon in which polarization is induced by the distortion of orientation, and mainly depends on the shape of a molecule. The negative liquid crystal material is less likely to experience the deformation such as spreading and bending. Note that the liquid crystal element 40 is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a VA-IPS mode, a guest-host mode, or the like can be used.

Furthermore, the display device 100A may be a normally black liquid crystal display device, for example, a transmissive liquid crystal display device using a vertical alignment (VA) mode. Examples of the vertical alignment mode include a multi-domain vertical alignment (MVA) mode, a patterned vertical alignment (PVA) mode, and an advanced super view (ASV) mode.

Note that the liquid crystal element is an element that controls transmission and non-transmission of light by optical modulation action of the liquid crystal. Optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is preferably used for the liquid crystal layer 113 in order to improve the temperature range. The liquid crystal composition which includes a liquid crystal exhibiting a blue phase and a chiral material has a short response time and exhibits optical isotropy, which makes the alignment process unnecessary. In addition, the liquid crystal composition which includes liquid crystal exhibiting a blue phase and a chiral material has a small viewing angle dependence. In addition, since an alignment film does not need to be provided and rubbing treatment is unnecessary, electrostatic discharge damage caused by the rubbing treatment can be prevented and defects or damage of the liquid crystal display device in the manufacturing process can be reduced.

As the display device 100A is a transmissive liquid crystal display device, a conductive material that transmits visible light is used for both the pixel electrode 111 and the common electrode 112. A conductive material that transmits visible light is used for one or more of the conductive layers included in the transistor 206. Accordingly, at least a part of the transistor 206 can be provided in the display region 68. FIGS. 2A and 2B show the case where a semiconductor material that transmits visible light is used for the conductive layer 222c.

For example, a material containing one or more of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film including graphene oxide.

An oxide conductive layer is preferably used for one or more of the conductive layer 222c, the pixel electrode 111, and the common electrode 112. The oxide conductive layer preferably includes one or more metal elements that are included in the semiconductor layer 231 of the transistor 206. For example, the conductive layer 222c preferably includes indium and is further preferably an oxide film including In, M, and Zn (M is Al, Ti, Ga, Y, Zr, La, Ce, Nd, Sn, or Hf). Similarly, each of the pixel electrode 111 and the common electrode 112 preferably includes indium and is further preferably an oxide film including In, M, and Zn (M is Al, Ti, Ga, Y, Zr, La, Ce, Nd, Sn, or Hf).

An oxide semiconductor may be used for one or more of the conductive layer 222c, the pixel electrode 111, and the common electrode 112. When two or more layers constituting the display device are formed using oxide semiconductors containing the same metal element, the same manufacturing equipment (e.g., film-formation equipment or processing equipment) can be used in two or more steps; manufacturing cost can thus be reduced.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive layer can be controlled by selecting treatment for increasing oxygen vacancies and/or impurity concentration on the oxide semiconductor layer, or treatment for reducing oxygen vacancies and/or impurity concentration on the oxide semiconductor layer. Note that such an oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

In addition, the manufacturing cost can be reduced by forming the oxide semiconductor layer and the oxide conductive layer using the same metal element. For example, the manufacturing cost can be reduced by using a metal oxide target with the same metal composition. By using the metal oxide target with the same metal composition, an etching gas or an etchant used in the processing of the oxide semiconductor layer can also be used for processing of the oxide conductive layer. Note that even when the oxide semiconductor layer and the oxide conductive layer have the same metal elements, they have different compositions in some cases. For example, a metal element in the film is released during the manufacturing process of the display device, which results in a different metal composition.

For example, when a silicon nitride film containing hydrogen is used for the insulating layer 212 and an oxide semiconductor is used for the conductive layer 222c, the conductivity of the oxide semiconductor can be increased by the hydrogen that is supplied from the insulating layer 212. For example, when a silicon nitride film containing hydrogen is used for the insulating layer 220 and an oxide semiconductor is used for the pixel electrode 111, the conductivity of the oxide semiconductor can be increased by the hydrogen that is supplied from the insulating layer 220.

In the display device 100A, the coloring layer 131 and the light-blocking layer 132 are provided closer to the substrate 61 than the liquid crystal layer 113 is. The coloring layer 131 is positioned in a region that at least overlaps with the display region 68 of a subpixel. In the non-display region 66 of a pixel (subpixel), the light-blocking layer 132 is provided. The light-blocking layer 132 overlaps with at least a part of the transistor 206.

The overcoat 121 is preferably provided between the coloring layer 131 or the light-blocking layer 132, and the liquid crystal layer 113. The overcoat 121 can reduce the diffusion of an impurity contained in the coloring layer 131 and the light-blocking layer 132 and the like into the liquid crystal layer 113.

The substrates 51 and 61 are bonded to each other by the adhesive layer 141. The liquid crystal layer 113 is encapsulated in a region that is surrounded by the substrates 51 and 61, and the adhesive layer 141.

When the display device 100A functions as a transmissive liquid crystal display device, two polarizers are positioned in a way that the display portion 62 is sandwiched between the two polarizers. FIG. 2A illustrates the polarizer 130 on the substrate 61 side. The light 45 from a backlight provided on the outside of the polarizer on the substrate 51 side enters the display device 100A through the polarizer. In this case, the optical modulation of the light can be controlled by controlling the alignment of the liquid crystal layer 113 with a voltage supplied between the pixel electrode 111 and the common electrode 112. That is, the intensity of light ejected through the polarizer 130 can be controlled. Furthermore, the coloring layer 131 absorbs light of wavelengths other than a specific wavelength range from the incident light. As a result, the ejected light is light that exhibits red, blue, or green colors, for example.

In addition to the polarizer, a circular polarizer can be used, for example. An example of a circular polarizer is a stack including a linear polarizer and a quarter-wave retardation plate. The circular polarizer can reduce the viewing angle dependence of the display quality of the display device.

The driver circuit portion 64 includes the transistor 201. FIG. 2B is an enlarged view of the transistor 201.

The transistor 201 includes the gate 221, the insulating layer 213, the semiconductor layer 231, the conductive layer 222a, and the conductive layer 222b. One of the conductive layers 222a and 222b functions as a source, and the other functions as a drain. The conductive layer 222a and the conductive layer 222b are electrically connected to the semiconductor layer 231.

As shown in FIG. 2B, the semiconductor layer 231 includes the first metal oxide layer 231a and the second metal oxide layer 231b over the first metal oxide layer 231a. The description of the transistor 206 can be referred to for the details of the semiconductor layer 231.

The transistor provided in the driver circuit portion 64 does not necessarily have a function of transmitting visible light. Thus, the conductive layer 222a and the conductive layer 222b can be formed using the same manufacturing step and the same material (preferably, a material with low resistivity such as metal).

In the connection portion 204, the wiring 65 and a conductive layer 251 are connected to each other, and the conductive layer 251 and a connector 242 are connected to each other. That is, in the connection portion 204, the wiring 65 is electrically connected to the FPC 72 through the conductive layer 251 and the connector 242. By employing this configuration, signals and power can be supplied from the FPC 72 to the wiring 65.

The wiring 65 can be formed using the same material and the same manufacturing step as those used for forming the conductive layer 222a and 222b included in the transistor 201 and the conductive layer 222a included in the transistor 206. The conductive layer 251 can be formed using the same material and the same manufacturing step as those used for forming the pixel electrode 111 included in the liquid crystal element 40. Forming the conductive layers constituting the connection portion 204 in such a manner, i.e., using the same materials and the same manufacturing steps as those used for forming the conductive layers composing the display portion 62 and the driver circuit portion 64, is preferable because this can reduce the number of process steps.

The transistors 201 and 206 may have the same structure or different structures. That is, the transistor included in the driver circuit portion 64 and the transistor included in the display portion 62 may have the same structure or different structures. In addition, the driver circuit portion 64 may have a plurality of transistors with different structures, and the display portion 62 may have a plurality of transistors with different structures. For example, a transistor having a structure in which two gates are electrically connected to each other is preferably used for one or more of a shift register circuit, a buffer circuit, and a protection circuit included in the scan line driver circuit.

[Structure Example of Subpixel]

Figure 4A:
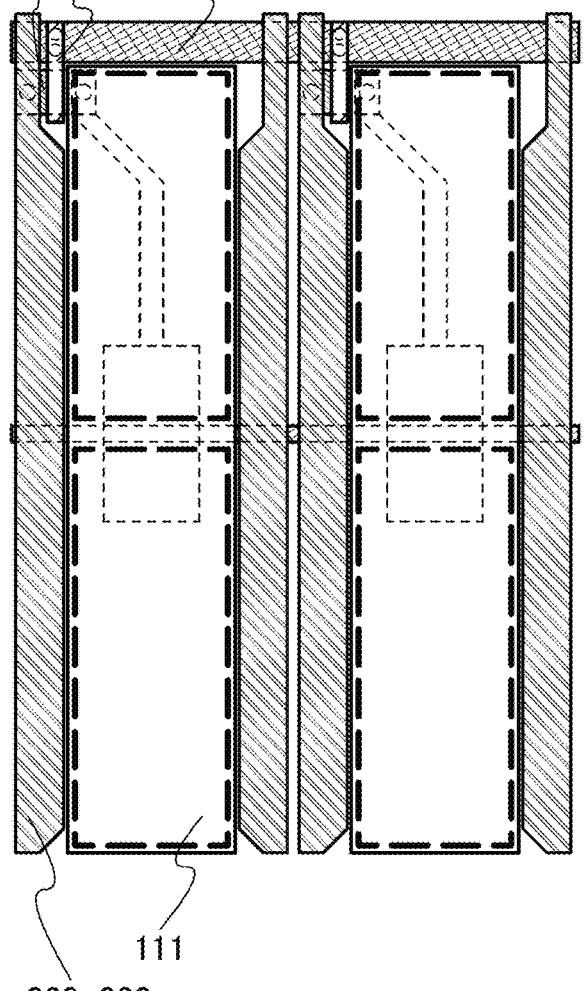
FIGS. 4A and 4B are top views showing an example of a subpixel.
Figure 4B:
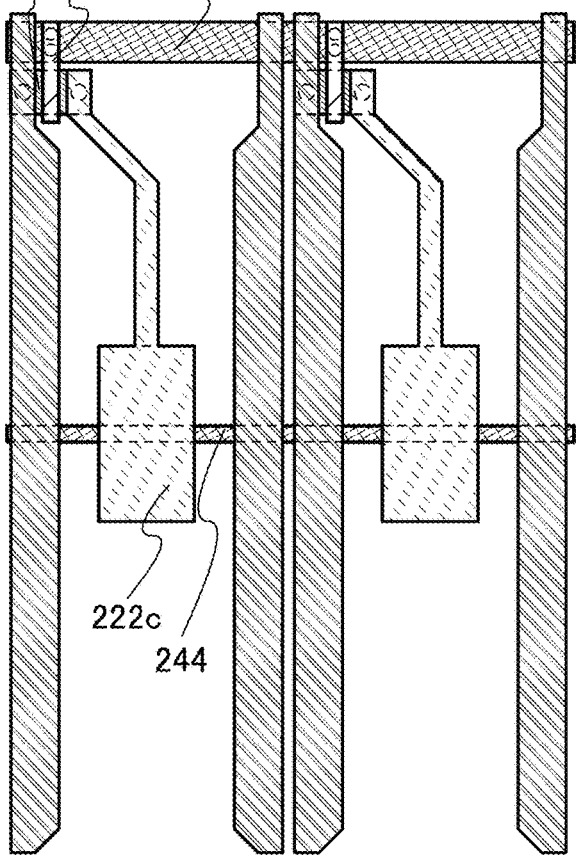
Figure 5A:
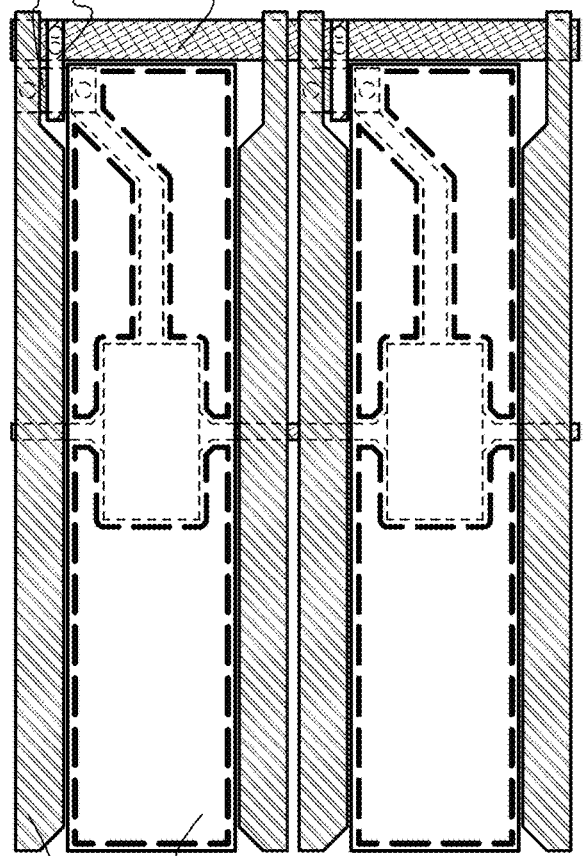
FIGS. 5A and 5B are top views showing an example of a subpixel.
Figure 5B:
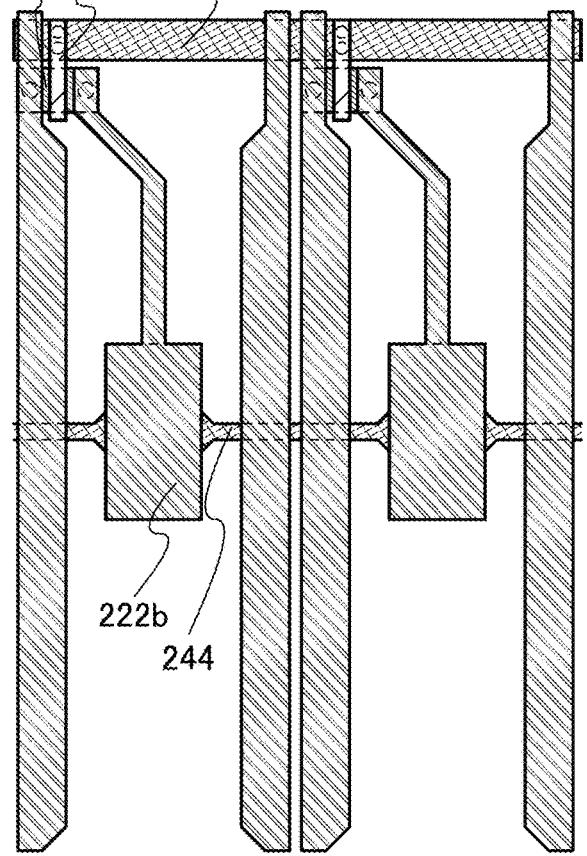

FIGS. 4A and 4B are top views of subpixels of one embodiment of the present invention. FIGS. 5A and 5B are top views of comparison subpixels.

First, characteristics of a pixel (a subpixel) of one embodiment of the present invention are described, though some of them have been described above.

A pixel includes a transistor, a capacitor, a scan line, a signal line, and the like. In general, these components are formed using metal films with low resistivity. Since a metal film does not transmit light, portions formed using metal films are excluded from a display region. This decreases the aperture ratio of a pixel. In particular, when the definition increases, the aperture ratio decreases significantly. In the case where the aperture ratio decreases in a liquid crystal display device, a backlight needs to emit a larger amount of light to increase the luminance and the contrast, leading to higher power consumption of the backlight.

In one embodiment of the present invention, a structure that transmits visible light is used in one or more of the transistor, the capacitor, the wiring, and the contact portion in the pixel. Specifically, a material that transmits visible light, such as an oxide semiconductor or an oxide conductor, is used in these components. These components provided in the pixel transmit visible light, so that the aperture ratio can be increased and the power consumption of the backlight can be decreased. Note that the scan line, the signal light, a power supply line, and a peripheral circuit are each formed of a metal material to decrease the resistance. As thus described, conductive films are preferably formed separately by selecting material depending on the functions of the components.

Using a material that transmits visible light, such as an oxide semiconductor or an oxide conductor, enables formation of transistors with a variety of structures. Unlike silicon, an oxide semiconductor has a visible light transmitting property even when the oxide semiconductor has reduced resistance by being doped with an impurity.

FIGS. 4A and 4B and FIGS. 5A and 5B are top views of subpixels each including a liquid crystal element with a vertical electric field mode such as a TN mode or a VA mode. FIGS. 4A and 4B are top views of subpixels of one embodiment of the present invention. FIGS. 5A and 5B are top views of comparison subpixels.

FIGS. 4A and 5A are top views of a layered structure from a gate 223 to the pixel electrode 111 in the subpixel that is seen from the pixel electrode 111 side. In FIGS. 4A and 5A, the display region 68 in the subpixel is outlined in a bold dotted line. FIGS. 4B and 5B are top views each obtained by excluding the pixel electrode 111 from the layered structure shown in FIG. 4A or FIG. 5A.

In each of the transistors shown in FIGS. 4A and 4B and FIGS. 5A and 5B, gates are provided over and under a channel.

The gate 221 and the gate 223 are electrically connected to each other. Transistors having such a structure in which two gates are electrically connected to each other can have a higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display device in which the number of wirings is increased because of an increase in size or definition. Moreover, with such a structure, a highly reliable transistor can be formed.

In other words, in FIGS. 4A and 4B and FIGS. 5A and 5B, one conductive layer functions as a scan line 228 and the gate 223. One of the gates 221 and 223 that has the lower resistance of the two is preferably the conductive layer that also functions as the scan line. It is preferable that the resistance of the conductive layer functioning as the scan line 228 be sufficiently low. Therefore, it is preferable that the conductive layer functioning as the scan line 228 be formed using a metal, an alloy, or the like. The conductive layer functioning as the scan line 228 may be formed using a material having a function of blocking visible light.

In FIGS. 4A and 4B and FIGS. 5A and 5B, one conductive layer functions as a signal line 229 and the conductive layer 222a. It is preferable that the resistance of the conductive layer functioning as the signal line 229 be sufficiently low. Therefore, it is preferable that the conductive layer functioning as the signal line 229 be formed using a metal, an alloy, or the like. The conductive layer functioning as the signal line 229 may be formed using a material having a function of blocking visible light.

The gates 221 and 223 can each include a single layer of one of a metal material and an oxide conductor, or stacked layers of both a metal material and an oxide conductor. For example, one of the gates 221 and 223 may include an oxide conductor, and the other of the gates 221 and 223 may include a metal material.

The transistor can include an oxide semiconductor layer as the semiconductor layer, and include an oxide conductive layer as at least one of the gates 221 and 223. In this case, the oxide semiconductor layer and the oxide conductive layer are preferably formed using an oxide semiconductor.

FIGS. 4A and 4B and FIGS. 5A and 5B show an example of providing a capacitor line 244 in the subpixel. The capacitor line 244 is electrically connected to a conductive layer formed using the same material and the same manufacturing step as those used for forming the conductive layer (e.g., the gate 221) included in the transistor. In FIGS. 4A and 4B, the conductive layer 222c that overlaps with the capacitor line 244 and transmits visible light is provided. In FIGS. 5A and 5B, the conductive layer 222b that overlaps with the capacitor line 244 and blocks visible light is provided. In FIGS. 4A and 4B, the conductive layer 222c is connected to the pixel electrode 111. In FIGS. 5A and 5B, the conductive layer 222b is connected to the pixel electrode 111.

In the structure shown in FIGS. 4A and 4B, the contact portion where the conductive layer 222c and the pixel electrode 111 are in contact with each other and at least part of the capacitor can be provided in the display region 68. Thus, the subpixel with the structure shown in FIGS. 4A and 4B can have a higher aperture ratio than the subpixel with the structure shown in FIGS. 5A and 5B. Moreover, the power consumption of the display device can be reduced.

When the contact portion where the pixel electrode 111 and the transistor are in contact with each other and the capacitor are provided in the display region 68 in one embodiment of the present invention, the aperture ratio can be increased by 10% or more, or 20% or more. Accordingly, the power consumption of the backlight can be decreased by 10% or more, or 20% or more.

The degree of change in the aperture ratio and the power consumption of the backlight due to change in the structure from that shown in FIGS. 5A and 5B to that shown in FIGS. 4A and 4B is estimated below.

Described here is the case where a display for a large TV is assumed and the layouts of the subpixels shown in FIGS. 4A and 4B and FIGS. 5A and 5B are used in TN mode liquid crystal display devices in which the pixel density is 136 ppi, the size of the display region is 65 inches diagonally, and the resolution is 8K.

The size of the subpixel is 62.5 μm×187.5 μm. The liquid crystal element has a vertical electric field mode. The storage capacitor can be formed between a gate wiring and a source wiring or a drain wiring. Since 120-Hz driving is assumed, two signal lines are provided in one subpixel. The transistor has a BGTC channel-etched structure.

The aperture ratio of the pixel layout shown in FIG. 5A is 37.3%. The aperture ratio of the pixel layout shown in FIG. 4A is 47.1%. By using a visible light transmitting structure for the contact portion where the transistor and the pixel electrode are in contact with each other and the storage capacitor, the aperture ratio can be 1.26 times as large as the aperture ratio of FIG. 5A. It is estimated that the power consumption of the backlight can be decreased by approximately 21%.

[Materials]

Next, the details of the materials that can be used for components of the display device of this embodiment and the like are described. Note that description on the components already described is omitted in some cases. The materials described below can be used as appropriate in the display device, a touch panel, and the components thereof described later.

«Substrates 51 and 61»

There are no large limitations on the material of the substrate used in the display device of one embodiment of the present invention; a variety of substrates can be used. For example, a glass substrate, a quartz substrate, a sapphire substrate, a semiconductor substrate, a ceramic substrate, a metal substrate, a plastic substrate or the like can be used.

The weight and thickness of the display device can be reduced by using a thin substrate. Furthermore, a flexible display device can be obtained by using a substrate that is thin enough to have flexibility.

The display device of one embodiment of the present invention is fabricated by forming a transistor and the like over a fabrication substrate, then transferring the transistor and the like on another substrate. The use of the fabrication substrate enables the following: a formation of a transistor with favorable characteristics; a formation of a transistor with low power consumption; a manufacturing of a durable display device, an addition of heat resistance to the display device, a manufacturing of a more lightweight display device, or a manufacturing of a thinner display device. Examples of a substrate to which a transistor is transferred include, in addition to the substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like.

«Transistors 201 and 206»

A transistor included in the display device of one embodiment of the present invention may have a top-gate structure or a bottom-gate structure. Gate electrodes may be provided above and below a channel. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

For example, a Group 14 element, a compound semiconductor, or an oxide semiconductor can be used for the semiconductor layer. Typically, a semiconductor including silicon, a semiconductor including gallium arsenide, or an oxide semiconductor including indium can be used for the semiconductor layer.

An oxide semiconductor is preferably used as a semiconductor in which a channel of the transistor is formed. In particular, an oxide semiconductor having a wider band gap than silicon is preferably used. The use of a semiconductor material with a larger bandgap than silicon and a small carrier density is preferable because the current during the off state (off-state current) of the transistor can be reduced.

For the oxide semiconductor, the above description and Embodiment 4 can be referred to, for example.

The use of such an oxide semiconductor achieves a highly reliable transistor with little change in the electrical characteristics.

Charge accumulated in the capacitor through the transistor can be retained for a long time because of low off-state current of the transistor. The use of such a transistor in pixels allows a driver circuit to stop while the gray level of a displayed image is maintained. As a result, a display device with extremely low power consumption is obtained.

The transistors 201 and 206 preferably include an oxide semiconductor layer that is highly purified to reduce the formation of oxygen vacancies. Accordingly, the off-state current of the transistors can be made small. Accordingly, an electrical signal such as an image signal can be held for a longer period, and a writing interval can be set longer in an on state. Accordingly, the frequency of refresh operation can be reduced, which leads to an effect of suppressing power consumption.

In the transistors 201 and 206, relatively high field-effect mobility can be obtained, whereby high-speed operation is possible. The use of such transistors that are capable of high-speed operation in the display device enables the fabrication of the transistor in the display portion and the transistor in the driver circuit portion over the same substrate. This means that a semiconductor device separately formed with a silicon wafer or the like does not need to be used as the driver circuit, which enables a reduction of the number of components in the display device. In addition, the transistor that can operate at high speed can be used also in the display portion, whereby a high-quality image can be provided.

«Insulating Layer»

An organic insulating material or an inorganic insulating material can be used as an insulating material that can be used for the insulating layer, the overcoat, the spacer, or the like included in the display device. Examples of an organic insulating material include an acrylic resin, an epoxy resin, a polyimide resin, a polyamide resin, a polyamide-imide resin, a siloxane resin, a benzocyclobutene-based resin, and a phenol resin. Examples of an inorganic insulating layer include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film «Conductive Layer»

For the conductive layer such as the gate, the source, and the drain of the transistor and the wiring and the electrode of the display device, a single-layer structure or a layered structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order can be employed. For example, in the case where the conductive layer has a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used.

An oxide conductive layer may be formed by controlling the resistivity of the oxide semiconductor.

«Adhesive layer 141»

A curable resin such as a heat-curable resin, a photocurable resin, or a two-component type curable resin can be used for the adhesive layer 141. For example, an acrylic resin, a urethane resin, an epoxy resin, or a siloxane resin can be used.

«Connector 242»

As the connector 242, for example, an anisotropic conductive film (ACF), an anisotropic conductive paste (ACP), and the like can be used.

«Coloring layer 131»

The coloring layer 131 is a colored layer that transmits light in a specific wavelength range. Examples of materials that can be used for the coloring layer 131 include a metal material, a resin material, and a resin material containing a pigment or dye.

«Light-blocking layer 132»

The light-blocking layer 132 is provided, for example, between adjacent coloring layers 131 for different colors. A black matrix formed with, for example, a metal material or a resin material containing a pigment or dye can be used as the light-blocking layer 132. Note that it is preferable to provide the light-blocking layer 132 also in a region other than the display portion 62, such as the driver circuit portion 64, in which case leakage of guided light or the like can be inhibited.

The thin films constituting the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As examples of a CVD method, a plasma-enhanced CVD (PECVD) method, a thermal CVD method, or the like can be given. As an example of the thermal CVD method, metal organic CVD (MOCVD) method can be given.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater. The thin films constituting the display device can be processed using a photolithography method or the like. Alternatively, island-shaped thin films may be formed by a film formation method using a blocking mask. Alternatively, the thin films may be processed by a nano-imprinting method, a sandblasting method, a lift-off method, or the like. As the photolithography method, there are a method in which a resist mask is formed over a thin film to be processed, the thin film is processed by etching or the like, and the resist mask is removed and a method in which a photosensitive thin film is formed, and the photosensitive thin film is exposed to light and developed to be processed in a desirable shape.

As light used in exposure in a photolithography method, light with an i-line (with a wavelength of 365 nm), light with a g-line (with a wavelength of 436 nm), light with an h-line (with a wavelength of 405 nm), and light in which the i-line, the g-line, and the h-line are mixed can be given. Alternatively, ultraviolet light, KrF laser light, ArF laser light, or the like can be used. Exposure may be performed by liquid immersion exposure technique. As light used in exposure, extreme ultra-violet light (EUV), X-rays or the like can be given. Instead of the light for the exposure, an electron beam can be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin films, dry etching, wet etching, a sandblast method, or the like can be used.

2. Structure Example 2 of Display Device

Figure 6:
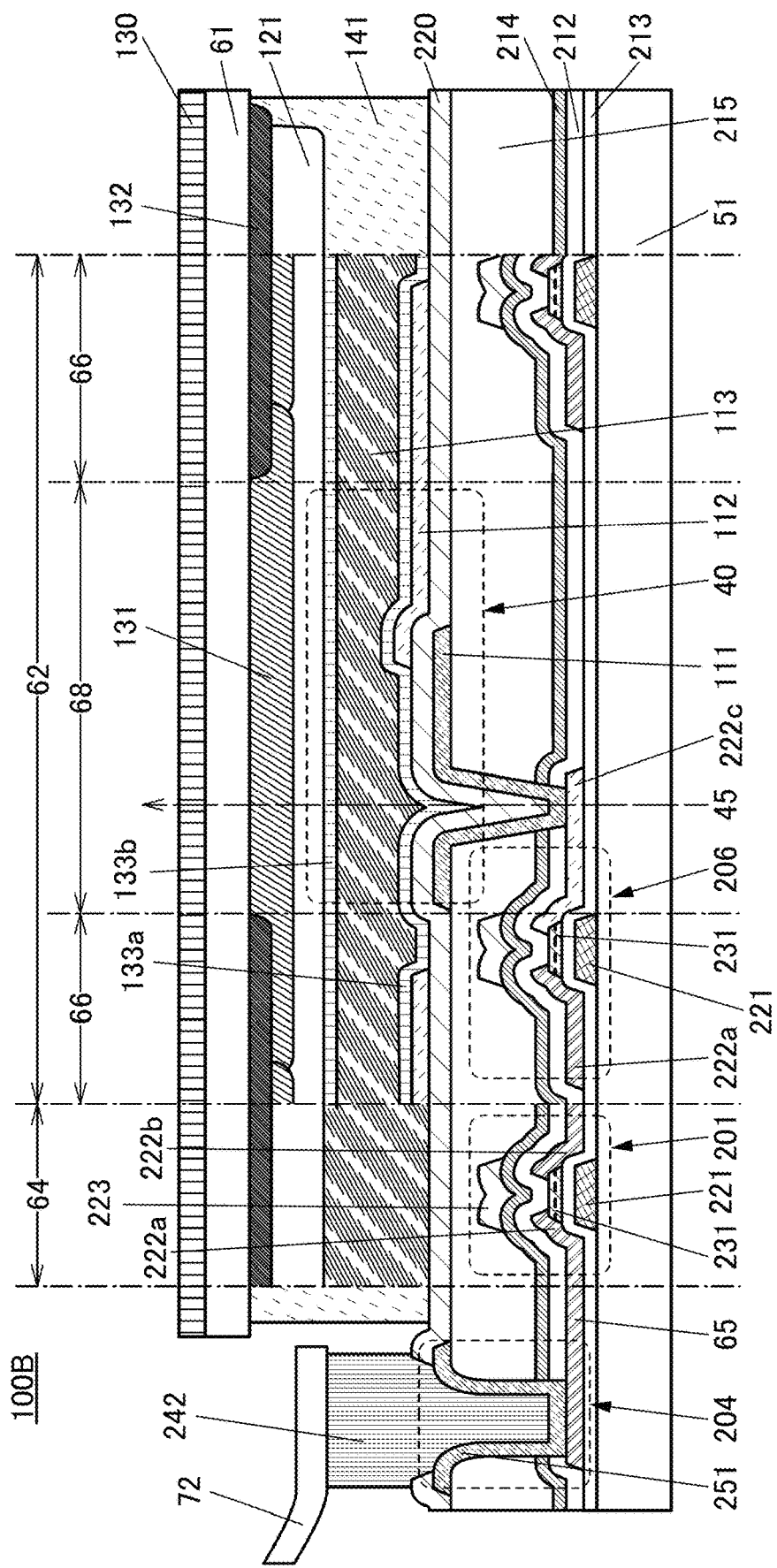
FIG. 6 is a cross-sectional view showing an example of a display device.
Figure 7:
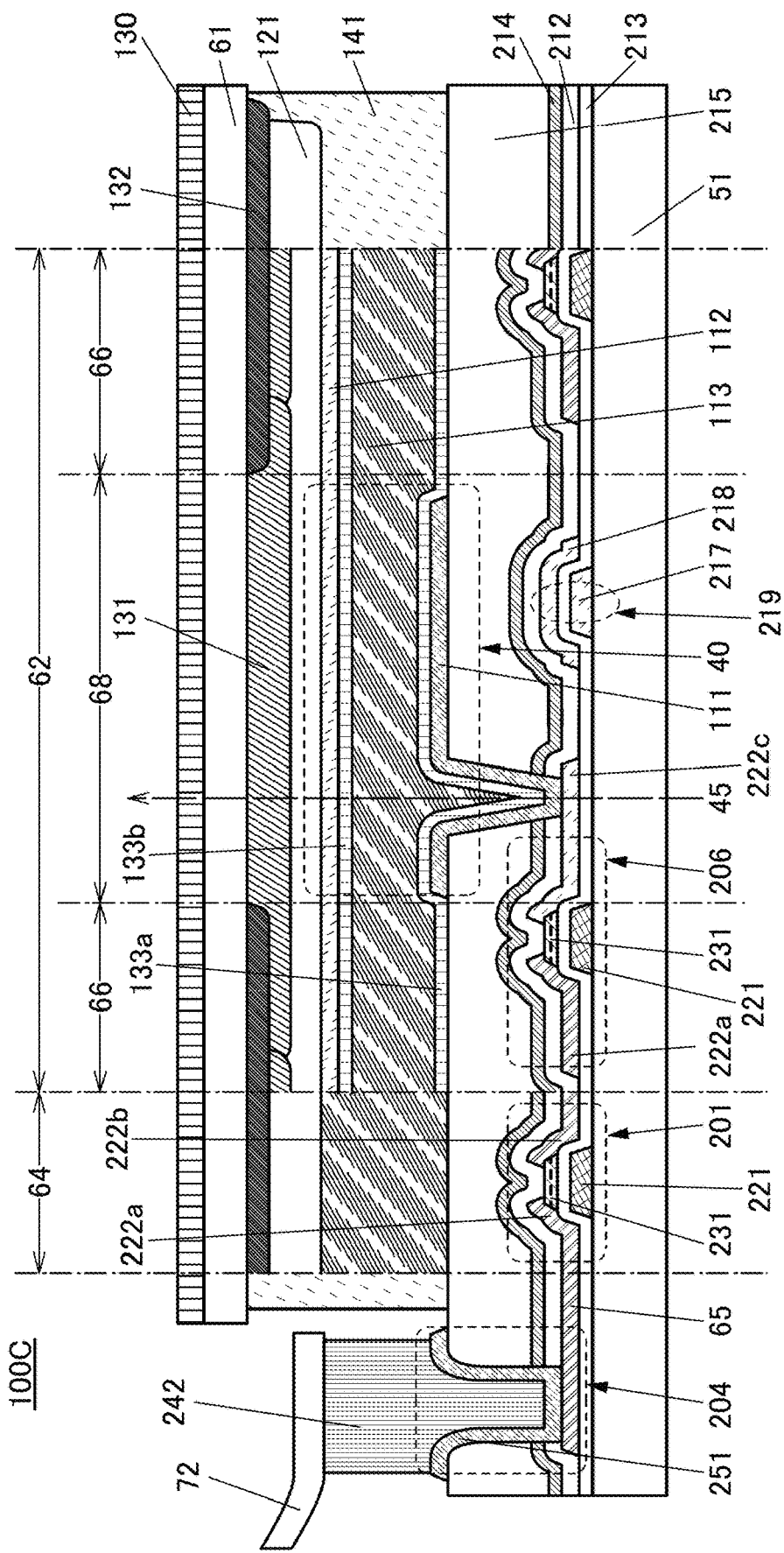
FIG. 7 is a cross-sectional view showing an example of a display device.

FIG. 6, FIG. 7, and FIGS. 8A to 8D show examples of the display device. FIG. 6 is a cross-sectional view of a display device 100B. FIG. 7 is a cross-sectional view of a display device 100C. FIG. 8A is a cross-sectional view of a display device 100D. Note that the perspective views of the display devices 100B, 100C, and 100D are not drawn here, as they are similar to the perspective view of the display device 100A, which is shown in FIG. 1.

The display device 100B shown in FIG. 6 is different from the display device 100A in the structure of the transistor.

Specifically, the transistors 201 and 206 in the display device 100B each include two gates, though the transistor in the display device 100A includes only one gate. As described above, it is preferable that the two gates be electrically connected to each other. Thus, the field-effect mobility of the transistor can be increased.

Other components are similar to those in the display device 100A; thus, the detailed description thereof is omitted.

The display device 100C shown in FIG. 7 is an example of a transmissive liquid crystal display device that includes a liquid crystal element with a vertical electric field mode. As shown in FIG. 7, the display device 100C includes the substrate 51, the transistor 201, the transistor 206, the liquid crystal element 40, a capacitor 219, the alignment film 133a, the alignment film 133b, the connection portion 204, the adhesive layer 141, the coloring layer 131, the light-blocking layer 132, the overcoat 121, the substrate 61, the polarizer 130, and the like.

The display portion 62 includes the transistor 206, the liquid crystal element 40, and the capacitor 219.

The transistor 206 includes the gate 221, the insulating layer 213, the conductive layer 222a, the conductive layer 222c, and the semiconductor layer 231.

Each of the conductive layers 222a and 222c is connected to the semiconductor layer 231.

The liquid crystal element 40 is a liquid crystal element with a VA mode. The liquid crystal element 40 includes the pixel electrode 111, the common electrode 112, and the liquid crystal layer 113. The liquid crystal layer 113 is positioned between the pixel electrode 111 and the common electrode 112.

The pixel electrode 111 is electrically connected to the semiconductor layer 231 of the transistor 206 with the conductive layer 222c positioned therebetween.

The capacitor 219 includes a conductive layer 217 and a conductive layer 218. The conductive layer 217 and the conductive layer 218 overlap with each other with the insulating layer 213 positioned therebetween.

The semiconductor layer 231, the conductive layer 222c, the conductive layer 217, and the conductive layer 218 are formed using a conductive material that transmits visible light. The conductive layer 218 and the conductive layer 222c can be formed using the same manufacturing step and the same material. Hence, the contact portion where the pixel electrode 111 and the transistor 206 are in contact with each other and the capacitor 219 can be provided in the display region 68. Accordingly, the aperture ratio can be increased.

When the overcoat 121 has a planarization function, the common electrode 112 can be provided flatly. This allows a thickness variation of the liquid crystal layer 113 to be reduced.

Examples of materials and formation methods of layers in the transistor 206 shown in FIG. 7 are described.

First, a conductive film that transmits visible light is formed as one electrode of the capacitor (the conductive layer 217), and a metal film such as a Cu film is formed by a sputtering method as the gate 221. The metal film also functions as a scan line. With the use of this metal film, the gate 221 and a gate wiring of a transistor in the peripheral circuit can be formed in the same manufacturing step.

Then, a stack of a silicon nitride film and a silicon oxynitride film is formed as the insulating layer 213 functioning as a gate insulating layer. Then, a stack of a CAC-OS film and a CAAC-OS film is formed by a sputtering method as the semiconductor layer 231. In the case where the CAAC-OS film with high chemical solution resistance and high plasma resistance is formed over the CAC-OS film, the semiconductor layer 231 is less damaged in the manufacturing process of the transistor. Then, an indium zinc oxide film is formed by a sputtering method as the conductive layer 222c functioning as a source electrode or a drain electrode. The semiconductor layer 231 and the conductive layer 222c can be formed by wet etching. In order to increase the selectivity so that the semiconductor layer 231 is not etched at the time of forming the conductive layer 222c, the conductive layer 222c is preferably formed using an etchant different from that used for forming the semiconductor layer 231. With the use of this indium zinc oxide film, the conductive layer 222c and the other electrode of the capacitor (the conductive layer 218) can be formed using the same manufacturing step.

Then, a metal film such as a Cu film is formed by a sputtering method as the signal line and the conductive layer 222a. With the use of this metal film, the signal line, the conductive layer 222a, and a source wiring and a drain wiring of a transistor in the peripheral circuit can be formed using the same manufacturing step.

Then, the insulating layer 212 and the insulating layer 214 functioning as a passivation film are formed by stacking a silicon oxynitride film and a silicon nitride film using a PECVD apparatus. Then, an acrylic resin is applied as the insulating layer 215 having a planarization function, and an opening portion (a contact opening) is formed. Then, an ITO film is formed as the pixel electrode 111.

Note that the metal film such as a Cu film, which is formed as the scan line, is preferably used for the gate electrode of the transistor included in the pixel. The metal film can suppress irradiation of a channel formation region with light emitted from the backlight. In FIG. 7, the contact portion where the transistor 206 and the pixel electrode 111 are in contact with each other and the capacitor 219 can transmit visible light.

The display device 100D shown in FIG. 8A is different from the above-described display device 100C in the positions and the shapes of the pixel electrode 111 and the common electrode 112.

Both of the pixel electrode 111 and the common electrode 112 may have a top-surface shape (also referred to as a planar shape) that has a comb-like shape or a top-surface shape that is provided with a slit.

In the display device 100D illustrated in FIG. 8A, the pixel electrode 111 and the common electrode 112 are provided on the same plane.

Alternatively, the electrodes may have a shape in which an edge of a slit in one electrode is aligned with an edge of a slit in the other electrode. The cross-sectional view of this case is shown in FIG. 8B.

Alternatively, the pixel electrode 111 and the common electrode 112 may have a portion overlapping with each other, when seen from above. The cross-sectional view of this case is shown in FIG. 8C.

Alternatively, the display portion 62 may have a portion where neither the pixel electrode 111 nor the common electrode 112 is provided, when seen from above. The cross-sectional view of this case is shown in FIG. 8D.

As described above, the display device of one embodiment of the present invention can include transistors and liquid crystal elements with various shapes.

3. Pixel Arrangement Example

Figure 9A:
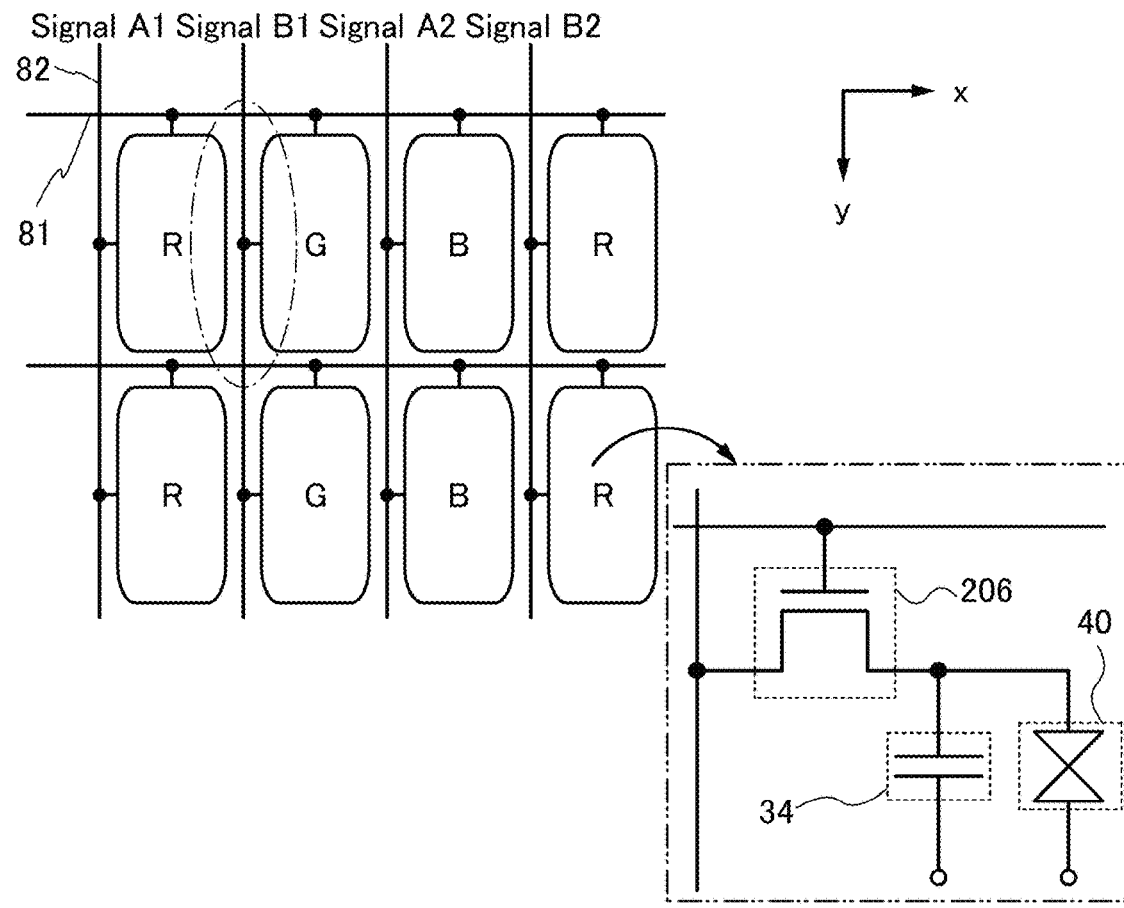
FIGS. 9A and 9B show layout examples and structure examples of pixels.
Figure 9B:
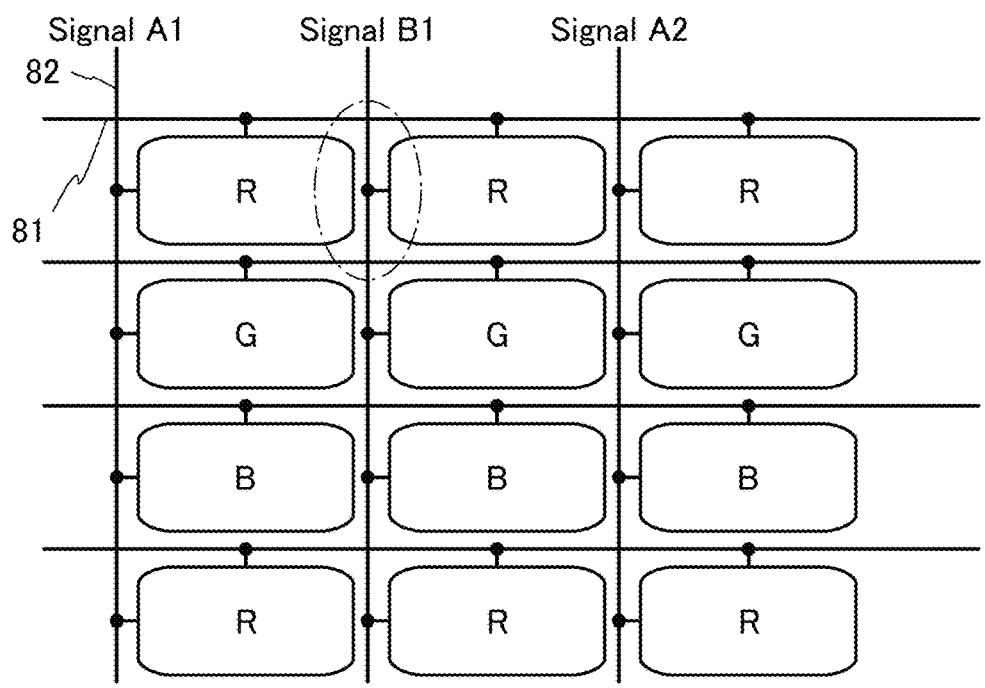

The pixel arrangement examples are shown in FIGS. 9A and 9B. FIGS. 9A and 9B show examples in which one pixel is composed of a red subpixel R, a green subpixel G, and a blue subpixel B. In FIGS. 9A and 9B, a plurality of scan lines 81 extend in the x direction, and a plurality of signal lines 82 extend in the y direction. The scan lines 81 and the signal lines 82 intersect with each other.

As shown by the dashed-two-dotted line in FIG. 9A, a subpixel includes the transistor 206, a capacitor 34, and the liquid crystal element 40. A gate of the transistor 206 is electrically connected to the scan line 81. One of a source and a drain of the transistor 206 is electrically connected to the signal line 82, and the other is electrically connected to one electrode of the capacitor 34 and one electrode of the liquid crystal element 40. The other electrode of the capacitor 34 and the other electrode of the liquid crystal element 40 are each supplied with a constant potential.

FIGS. 9A and 9B show examples where source-line inversion driving is adopted. Signals A1 and A2 are signals with the same polarity. Signals B1 and B2 are signals with the same polarity. Signals A1 and B1 are signals with different polarities. Signals A2 and B2 are signals with different polarities.

As the definition of the display device becomes higher, the distance between subpixels becomes shorter. Thus, as shown in the frame outlined in a dashed-dotted line in FIG. 9A, in the subpixel where the signal A1 is input, the liquid crystal is easily affected by potentials in both the signal A1 and the signal B1, in the vicinities of the signal line 82 where the signal B1 is input. This can make the liquid crystal more prone to alignment defects.

In FIG. 9A, the direction in which a plurality of subpixels exhibiting the same color are aligned is the y direction, and is substantially parallel to the direction where the signal lines 82 extend. As shown in the frame outlined in the dashed-dotted line in FIG. 9A, subpixels exhibiting different colors are adjacent to each other, with the longer sides of the subpixels facing each other.

In FIG. 9B, the direction in which a plurality of subpixels exhibiting the same color are aligned is the x direction, and intersects with the direction where the signal lines 82 extend. As shown in the frame outlined in a dashed-dotted line in FIG. 9B, subpixels exhibiting the same color are adjacent to each other, with the shorter sides of the subpixels facing each other.

When the side of the subpixel that is substantially parallel to the direction in which the signal lines 82 extend is the shorter side of the subpixel as illustrated in FIG. 9B, the region where the liquid crystal is more prone to alignment defects can be made narrower, compared with the case (illustrated in FIG. 9A) where the longer side of the subpixel is substantially parallel to the direction in which the signal lines 82 extend. When the region where the liquid crystal is more prone to alignment defects is positioned between subpixels exhibiting the same color as illustrated in FIG. 9B, display defects are less easily recognized by a user of the display device when compared with the case (see FIG. 9A) where the region is positioned between subpixels exhibiting different colors. In one embodiment of the present invention, the direction in which the plurality of subpixels exhibiting the same color are arranged preferably intersects with the direction in which the signal lines 82 extend.

4. Structure Example 3 of Display Device

One embodiment of the present invention can be applied to a display device in which a touch sensor is implemented; such a display device is also referred to as an input/output device or a touch panel. Any of the structures of the display device described above can be applied to the touch panel. In this embodiment, the description focuses on an example in which the touch sensor is implemented in the display device 100A.

There is no limitation on the sensing element (also referred to as a sensor element) included in the touch panel of one embodiment of the present invention. A variety of sensors capable of sensing an approach or a contact of an object such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive touch sensor element include a surface capacitive touch sensor element and a projected capacitive touch sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 10A:
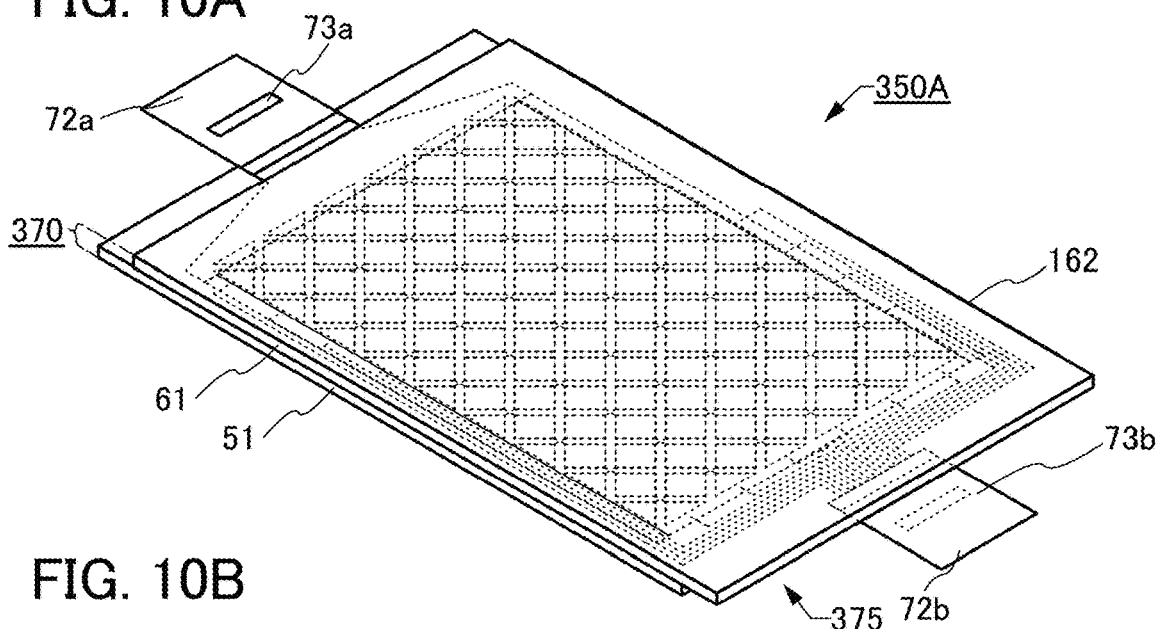
FIGS. 10A and 10B are perspective views showing an example of a display device.
Figure 10B:
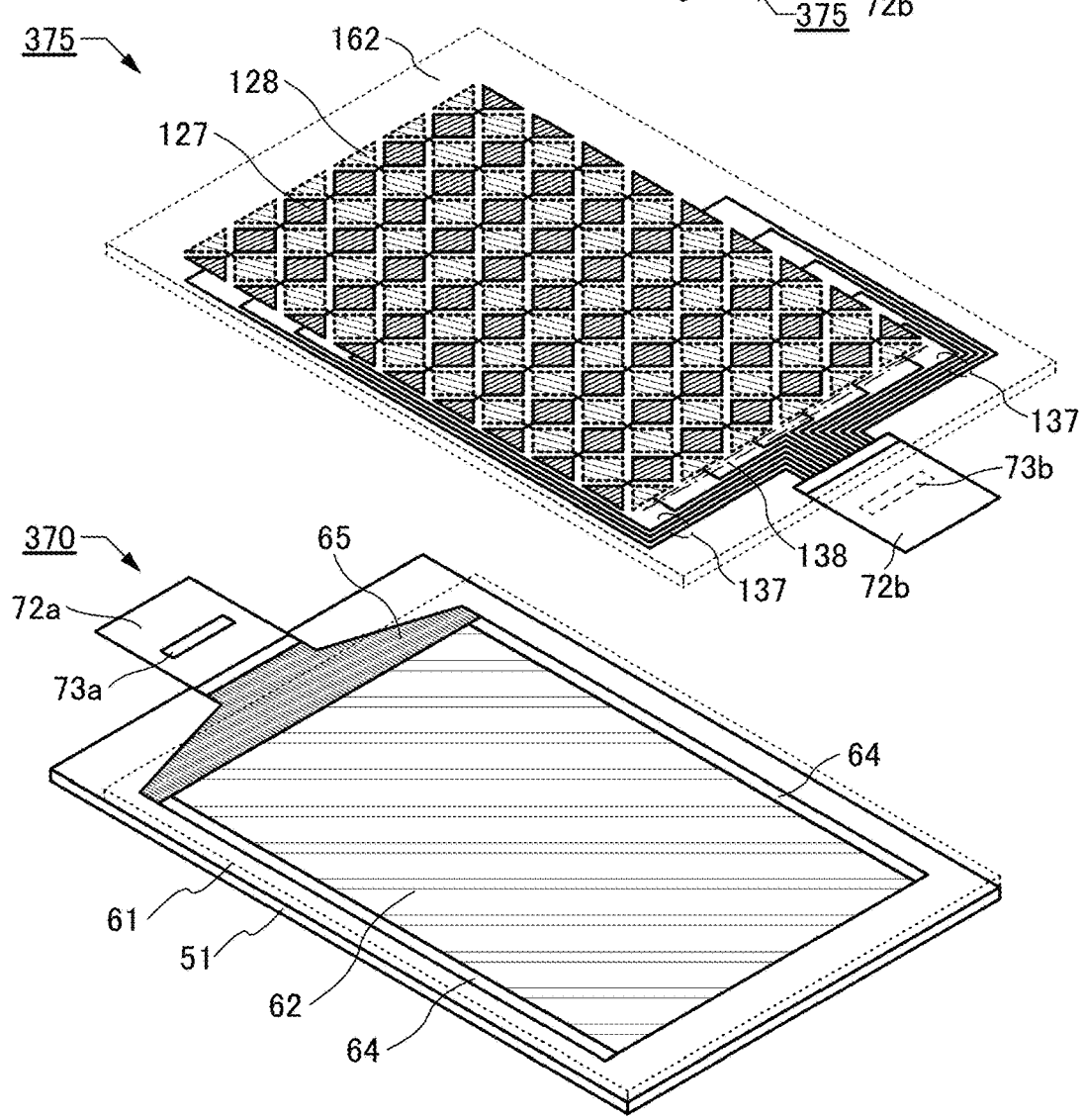

FIGS. 10A and 10B illustrate an example of the touch panel. FIG. 10A is a perspective view of a touch panel 350A. FIG. 10B is a developed view of the schematic perspective view of FIG. 10A. Note that for simplicity, FIGS. 10A and 10B illustrate only the major components. In FIG. 10B, the outlines of the substrate 61 and a substrate 162 are illustrated only in dashed lines.

The touch panel 350A has a structure in which a display device and a sensor element that are fabricated separately are bonded together.

The touch panel 350A includes an input device 375 and a display device 370 that are provided to overlap with each other.

The input device 375 includes the substrate 162, an electrode 127, an electrode 128, a plurality of wirings 137, and a plurality of wirings 138. An FPC 72b is electrically connected to each of the plurality of wirings 137 and the plurality of wirings 138. An IC 73b is provided on the FPC 72b.

The display device 370 includes the substrate 51 and the substrate 61 which are provided to face each other. The display device 370 includes the display portion 62 and the driver circuit portion 64. The wiring 65 and the like are provided over the substrate 51. An FPC 72a is electrically connected to the wiring 65. An IC 73a is provided on the FPC 72a.

The wiring 65 supplies signals and power to the display portion 62 and the driver circuit portion 64. The signals and power are input to the wiring 65 from the outside or the IC 73a, through the FPC 72a.

The display device 100A shown in FIG. 2A can be used as the display device 370 shown in FIGS. 10A and 10B.

5. Structure Example 4 of Display Device

FIGS. 11A and 11B illustrate an example of the touch panel. FIG. 11A is a perspective view of a touch panel 350B. FIG. 11B is a developed view of the schematic perspective view of FIG. 11A. Note that for simplicity, FIGS. 11A and 11B illustrate only the major components. In FIG. 11B, the outline of the substrate 61 is illustrated only in a dashed line.

The touch panel 350B is an in-cell touch panel that has a function of displaying an image and serves as a touch sensor.

The touch panel 350B has a structure in which electrodes constituting a sensor element and the like are provided only on the counter substrate. Such a structure can make the touch panel thinner and more lightweight or reduce the number of components within the touch panel, compared with a structure in which the display device and the sensor element are fabricated separately and then are bonded together.

In FIGS. 11A and 11B, an input device 376 is provided on the substrate 61. The wirings 137 and 138 and the like of the input device 376 are electrically connected to the FPC 72 included in a display device 379. For example, in a connection portion 63, one of the wirings 137 (or the wirings 138) and the conductive layer provided on the substrate 51 side are electrically connected to each other through a connector.

With the above structure, the FPCs connected to the touch panel 350B can be provided only on one substrate side (on the substrate 51 side in this embodiment). Although two or more FPCs may be attached to the touch panel 350B, it is preferable that the touch panel 350B be provided with one FPC 72 which has a function of supplying signals to both the display device 379 and the input device 376 as illustrated in FIGS. 11A and 11B, for the simplicity of the structure. The touch panel 350B can easily be incorporated into an electronic device and allows a reduction in the number of components compared with the case where FPCs are connected to both the substrate 51 and the substrate 61.

The IC 73 may include a function of driving the input device 376. Another IC that drives the input device 376 may be provided over the FPC 72. Alternatively, an IC that drives the input device 376 may be mounted on the substrate 51.

In the conductive layers included in the input device, the conductive layers that overlap with the display region 68 are formed using a material that transmits visible light. Note that the conductive layers in the input device may be arranged only in the non-display region 66. When the conductive layer in the input device does not overlap with the display region 68, the conductive layer does not need to be formed with a material that transmits visible light. A material with a low resistivity such as a metal can be used for the conductive layer included in the input device. For example, the wiring and the electrode of the touch sensor are preferably formed with a metal mesh, thereby having a lower resistance. In that case, the touch sensor is suitably used in a large-sized display device. Note that a metal, which is generally a material having a high reflectivity, can be darkened by being subjected to oxidation treatment or the like. Thus, even when the display device is seen from the display surface side, a decrease in visibility due to the reflection of external light can be suppressed.

The wiring and the electrode can be formed with a stack of a metal layer and a layer with a low reflectivity (the layer is also referred to as a dark-colored layer). Examples of the dark-colored layer include a layer containing copper oxide, and a layer containing copper chloride or tellurium chloride. Alternatively, the dark-colored layer may be formed with a metal particle such as an Ag particle, an Ag fiber, or a Cu particle, a carbon nanoparticle such as a carbon nanotube (CNT) or graphene, a conductive high molecule such as PEDOT, polyaniline, or polypyrrole, or the like.

The display device in this embodiment includes the region where the transistor transmits visible light, allowing an increase in the aperture ratio of the pixel. Thus, the power consumption of the display device can be reduced.

This embodiment can be combined with any of other embodiments as appropriate. In the case where a plurality of structure examples are described in one embodiment in this specification, some of the structure examples can be combined as appropriate.

Embodiment 2

In this embodiment, an operation mode which can be employed in the display device of one embodiment of the present invention is described with reference to FIGS. 12A to 12C.

A normal driving mode (Normal mode) with a normal frame frequency (typically, higher than or equal to 60 Hz and lower than or equal to 240 Hz) and an idling stop (IDS) driving mode with a low frame frequency are described below.

Note that the IDS driving mode refers to a driving method in which after image data is written, rewriting of image data is stopped. This increases the interval between writing of image data and subsequent writing of image data, thereby reducing the power that would be consumed by writing of image data in that interval. The IDS driving mode can be performed at a frame frequency which is $1/100$ to $1/10$ of the normal driving mode, for example. A still image is displayed by the same video signals in consecutive frames. Thus, the IDS driving mode is particularly effective when displaying a still image. When an image is displayed using IDS driving, power consumption is reduced, image flickering (flicker) is suppressed, and eyestrain can be reduced.

Figure 12A:
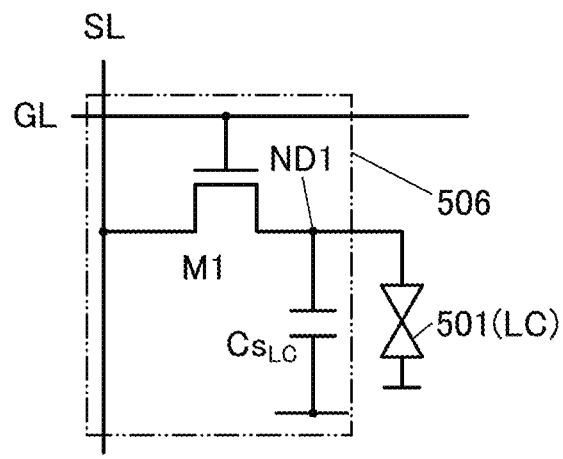
FIGS. 12A to 12C show examples of an operation mode.
Figure 12B:
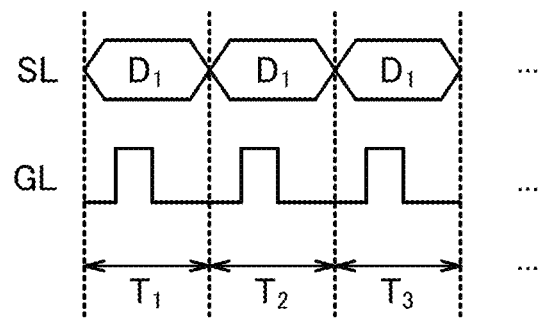
Figure 12C:
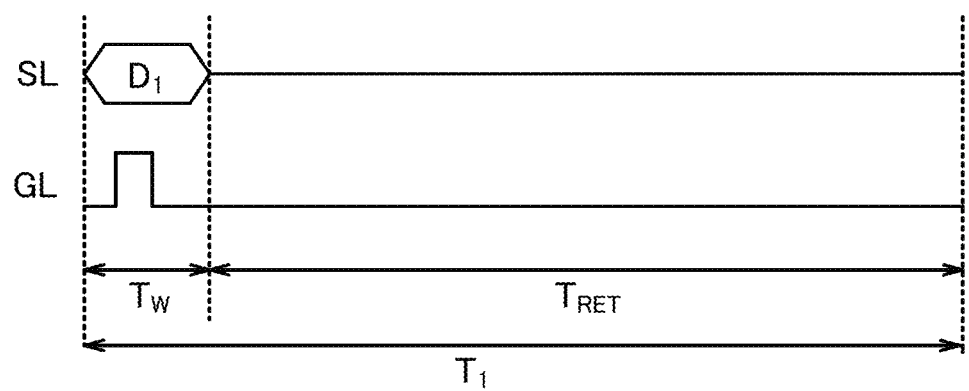

FIG. 12A is a pixel circuit diagram, FIGS. 12B and 12C are timing charts showing a normal driving mode and an IDS driving mode. Note that in FIG. 12A, a first display element 501 (here, a reflective liquid crystal element) and a pixel circuit 506 electrically connected to the first display element 501 are illustrated. In the pixel circuit 506 illustrated in FIG. 12A, a signal line SL, a gate line GL, a transistor M1 connected to the signal line SL and the gate line GL, and a capacitor $Cs_{LC}$ connected to the transistor M1 are illustrated.

The transistor M1 may become a leakage path of data $D_1$. Accordingly, the off-state current of the transistor M1 is preferably as low as possible. A transistor including a metal oxide in a semiconductor layer in which a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer in which a channel is formed (OS transistor) is described. The OS transistor has a feature of extremely low leakage current (off-state current) in an off state compared with a transistor including polycrystalline silicon or the like. When the OS transistor is used as the transistor M1, electric charges supplied to a node ND1 can be held for a long period.

In the circuit diagram illustrated in FIG. 12A, the liquid crystal element LC becomes a leakage path of data $D_1$. Therefore, to perform IDS driving appropriately, the resistivity of the liquid crystal element LC is preferably higher than or equal to $1.0 \times 10^{14}$ Ω·cm.

Note that for example, an oxide including In, Ga, and Zn, an oxide including In and Zn, or the like can be suitably used for a channel region of the above OS transistor. The oxide including In, Ga, and Zn can typically have an atomic ratio of In:Ga:Zn=4:2:4.1 or a neighborhood thereof.

FIG. 12B is a timing chart showing the waveforms of signals supplied to the signal line SL and the gate line GL in the normal driving mode. In the normal driving mode, a normal frame frequency (e.g., 60 Hz) is used for operation. FIG. 12B shows a period $T_1$, a period $T_2$, and a period $T_3$. A scan signal is supplied to the gate line GL in each frame period and data $D_1$ is written from the signal line SL to the node ND1. This operation is performed both to write the same data $D_1$ in the periods $T_1$ to $T_3$ and to write different data in the periods $T_1$ to $T_3$.

FIG. 12C is a timing chart showing the waveforms of signals supplied to the signal line SL and the gate line GL in the IDS driving mode. In the IDS driving, a low frame frequency (e.g., 1 Hz) is used for operation. One frame period is denoted by a period $T_1$ and includes a data writing period Tw and a data retention period $T_{RET}$. In the IDS driving mode, a scan signal is supplied to the gate line GL and the data $D_1$ of the signal line SL is written in the period Tw, the gate line GL is fixed to a low-level voltage in the period $T_{RET}$, and the transistor M1 is turned off so that the written data $D_1$ is retained. Note that the low frame frequency may be higher than or equal to 0.1 Hz and lower than 60 Hz, for example.

This embodiment can be combined with any of other embodiments as appropriate.

Embodiment 3

In this embodiment, a driving method of a touch sensor is described with reference to drawings.

<Example of Sensing Method of Sensor>

Figure 13A:
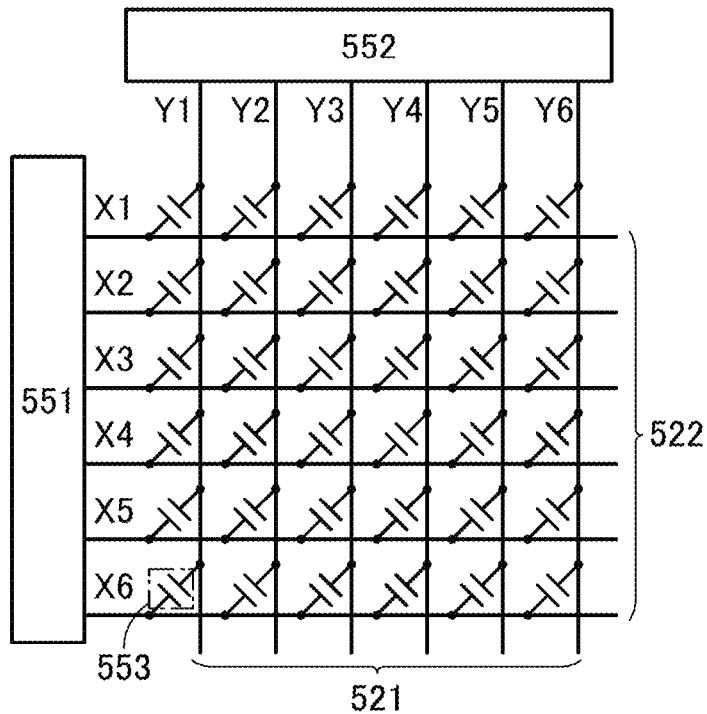
FIGS. 13A and 13B are a block diagram and a timing chart of a touch sensor.

FIG. 13A is a block diagram illustrating the structure of a mutual capacitive touch sensor. FIG. 13A illustrates a pulse voltage output circuit 551 and a current sensing circuit 552. Note that in FIG. 13A, six wirings X1 to X6 represent electrodes 521 to which a pulse voltage is applied, and six wirings Y1 to Y6 represent electrodes 522 that sense changes in current. FIG. 13A also illustrates a capacitor 553 that is formed where the electrodes 521 and 522 overlap with each other. Note that functional replacement between the electrodes 521 and 522 is possible.

The pulse voltage output circuit 551 is a circuit for sequentially applying a pulse voltage to the wirings X1 to X6. By application of a pulse voltage to the wirings X1 to X6, an electric field is generated between the electrodes 521 and 522 of the capacitors 553. When the electric field between the electrodes is shielded, for example, a change occurs in the capacitor 553 (mutual capacitance). The approach or contact of a sensing target can be sensed by utilizing this change.

The current sensing circuit 552 is a circuit for detecting changes in current flowing through the wirings Y1 to Y6 that are caused by the change in mutual capacitance in the capacitor 553. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current.

Note that one or both of the pulse voltage output circuit 551 and the current sensing circuit 552 may be formed over the substrate 51 or the substrate 61 that is shown in FIG. 1 or the like. For example, it is preferable to form the display portion 62, the driver circuit portion 64, and the like at the same time because the process can be simplified and the number of components used for driving the touch sensor can be reduced. One or both of the pulse voltage output circuit 551 and the current sensing circuit 552 may be mounted on the IC 73.

In particular, in the case of using crystalline silicon such as polycrystalline silicon or single crystal silicon for the semiconductor layer where a channel is formed in the transistor over the substrate 51, driving characteristics of the pulse voltage output circuit 551, the current sensing circuit 552, or the like are increased and sensitivity of the touch sensor can be thus increased.

Figure 13B:
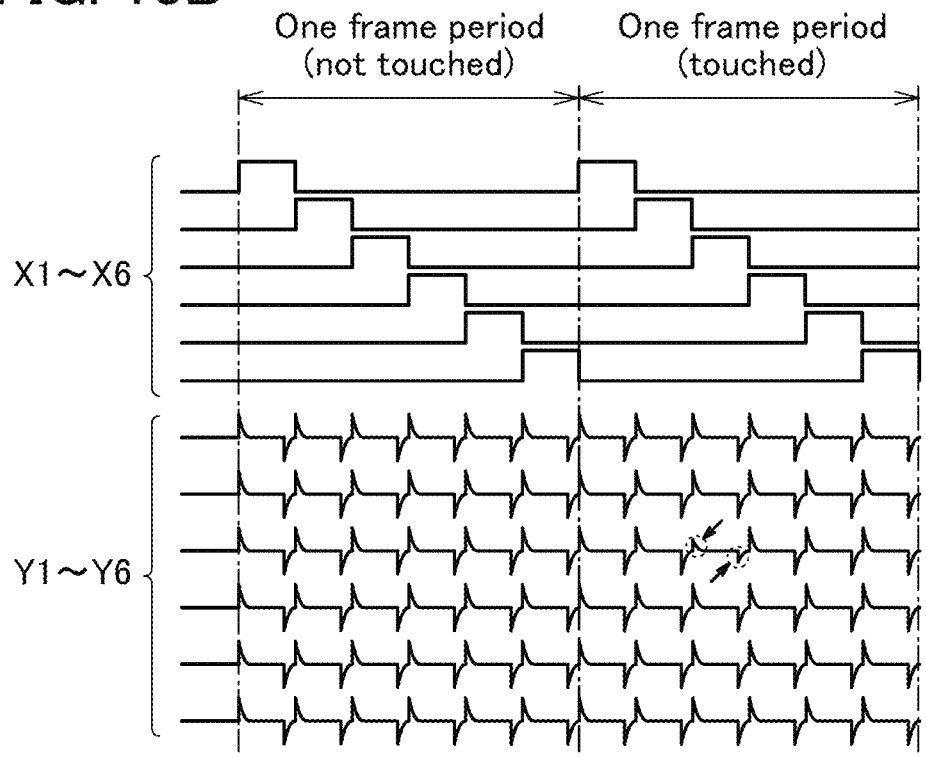

FIG. 13B is a timing chart showing input and output waveforms in the mutual capacitive touch sensor illustrated in FIG. 13A. In FIG. 13B, sensing of a sensing target is performed in all the rows and columns in one frame period. FIG. 13B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By sensing a change in mutual capacitance in this manner, the approach or contact of a sensing target can be sensed.

<Example of Driving Method of Display Device>

Figure 14A:
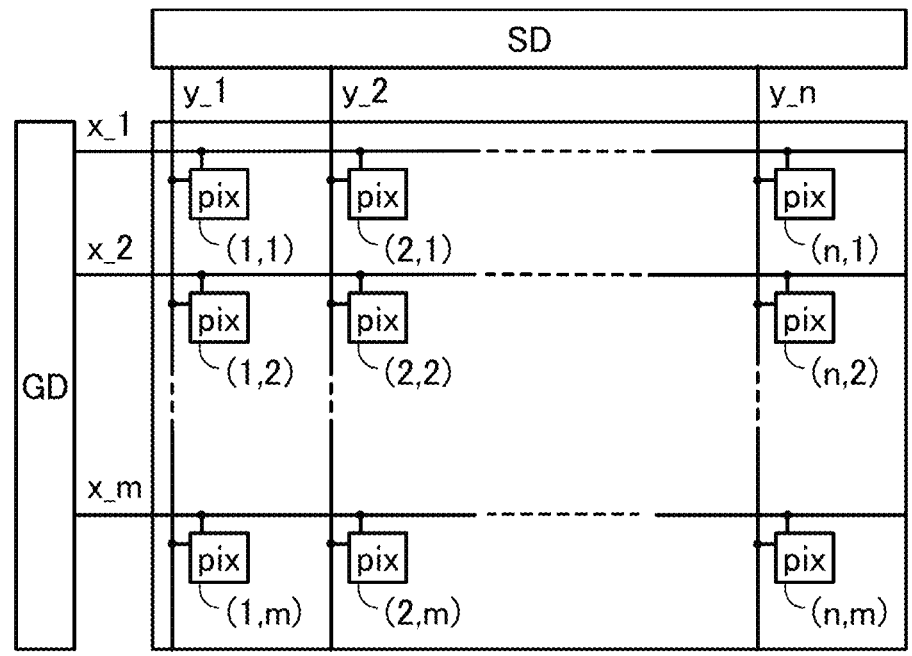
FIGS. 14A and 14B are a block diagram and a timing chart of a display device.

FIG. 14A is a block diagram illustrating a configuration example of a display device. FIG. 14A illustrates a gate driver circuit GD (a scan line driver circuit), a source driver circuit SD (a signal line driver circuit), and a display portion including a plurality of pixels pix. In FIG. 14A, gate lines x_1 to x_m (in is a natural number) electrically connected to the gate driver circuit GD and source lines y_1 to y_n (n is a natural number) electrically connected to the source driver circuit SD are shown. Corresponding to these lines, the pixels pix are denoted by (1, 1) to (n, m).

Figure 14B:
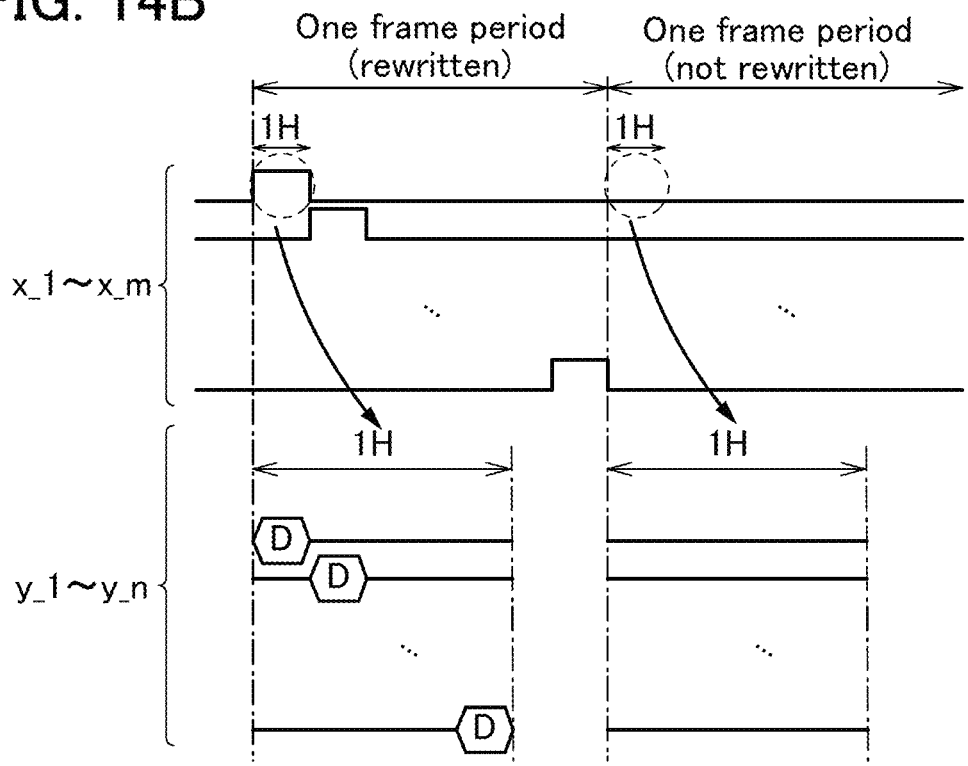

FIG. 14B is a timing chart of signals supplied to the gate lines and the source lines in the display device shown in FIG. 14A. The periods in FIG. 14B show the case where data signals are rewritten every frame period and the case where data signals are not rewritten. Note that periods such as a retrace period are not taken into consideration in FIG. 14B.

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, supply of scan signals to the gate lines x_1 to x_m is stopped. In the horizontal scanning period 1H, supply of data signals to the source lines y_1 to y_n in the columns is stopped.

A driving method in which data signals are not rewritten every frame period is effective particularly when an oxide semiconductor is used for the semiconductor layer where a channel is formed in the transistor included in the pixel pix. A transistor including an oxide semiconductor can have much lower off-state current than a transistor including a semiconductor such as silicon. Thus, a data signal written in the previous period can be held without rewriting data signals every frame period, and grayscale of pixels can be held for 1 second or longer, preferably 5 seconds or longer, for example.

In the case where polycrystalline silicon or the like is used for a semiconductor layer where a channel of a transistor included in the pixel pix is formed, the storage capacitance of the pixel is preferably increased in advance. The larger the storage capacitance is, the longer the grayscale of the pixel can be held. The storage capacitance may be determined depending on leakage current of a transistor or a display element which is electrically connected to the storage capacitor. For example, the storage capacitance per pixel is set to 5 ff to 5 pF inclusive, preferably 10 ff to 5 pF inclusive, further preferably 20 ff to 1 pF inclusive, so that a data signal written in the previous period can be held without rewriting data signals every frame period. For example, grayscale of a pixel can be held for several frame periods or several tens of frame periods.

<Example of Driving Method of Display Portion and Touch Sensor>

Figure 15A:
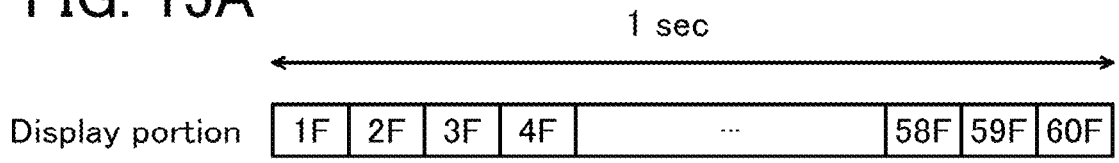
FIGS. 15A to 15D show the operations of a display portion and a touch sensor.

FIGS. 15A to 15D show examples of the operations in successive frame periods of the touch sensor described with reference to FIGS. 13A and 13B and the display portion described with reference to FIGS. 14A and 14B that are driven for 1 sec (one second). In FIG. 15A, one frame period for the display portion is 16.7 ms (frame frequency: 60 Hz), and one frame period for the touch sensor is 16.7 ms (frame frequency: 60 Hz).

Figure 15B:
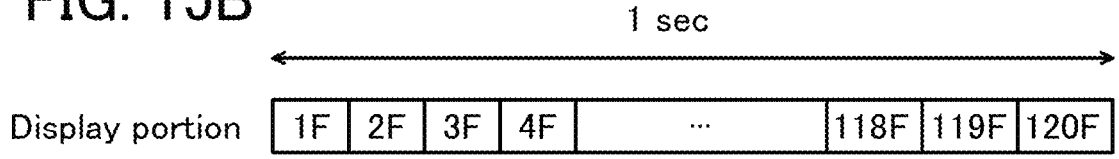

In the display device of one embodiment of the present invention, the display portion and the touch sensor operate independently of each other, and the display device can have a touch sensing period concurrent with a display period. That is why one frame period for the display portion and one frame period for the touch sensor can both be 16.7 ms (frame frequency: 60 Hz) as shown in FIG. 15A. The frame frequency for the touch sensor may differ from that of the display portion. For example, as shown in FIG. 15B, one frame period for the display portion may be 8.3 ms (frame frequency: 120 Hz) and one frame period for the touch sensor may be 16.7 ms (frame frequency: 60 Hz). The frame frequency for the display portion may be 33.3 ms (frame frequency: 30 Hz) (not shown).

The frame frequency for the display portion may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). With this structure, power consumption of the display device can be reduced. The frame frequency for the touch sensor may be changeable, and the frame frequency in waiting may differ from the frame frequency in sensing a touch.

Moreover, in the display device of one embodiment of the present invention, the following operation is possible: data signals are not rewritten in the display portion and a data signal written in the previous period is held. In that case, one frame period of the display portion can be longer than 16.7 ms. Thus, as shown in FIG. 15C, the operation can be switched so that one frame period for the display portion is 1 sec (frame frequency: 1 Hz) and one frame period for the touch sensor is 16.7 ms (frame frequency: 60 Hz).

Note that for the operation in which data signals are not rewritten in the display portion and a data signal written in the previous period is held, the above-described IDS driving mode can be referred to. As the IDS driving mode, a partial IDS driving mode may be employed in which data signals are rewritten only in a specific region of the display portion. The partial IDS driving mode is a mode in which data signals are rewritten only in a specific region of the display portion and a data signal written in the previous period is held in the other region.

Figure 15C:
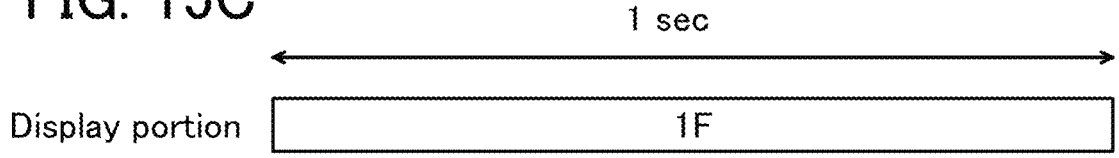
Figure 15D:
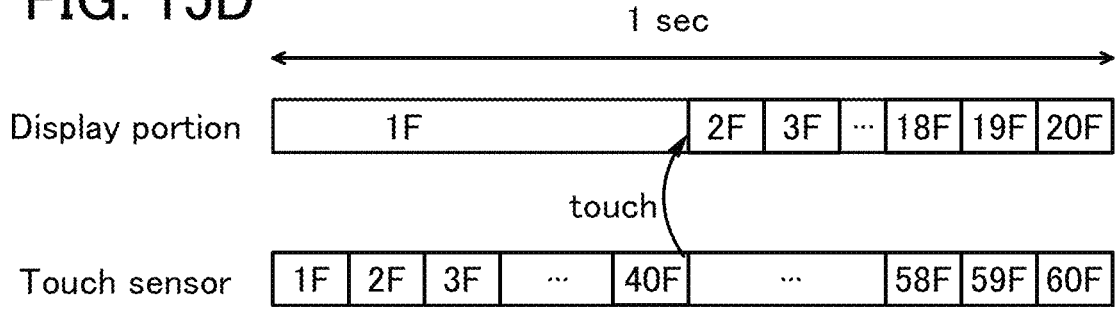

Furthermore, by the driving method of a touch sensor that is disclosed in this embodiment, the touch sensor can be continuously driven in the case of FIG. 15C. Thus, data signals in the display portion can also be rewritten when the approach or contact of a sensing target is sensed by the touch sensor, as shown in FIG. 15D.

If rewriting of data signals in a display portion is performed during a sensing period of a touch sensor, noise caused by rewriting of the data signals travels through the touch sensor and the sensitivity of the touch sensor might decrease. For this reason, rewriting of data signals in a display portion and sensing by a touch sensor are preferably performed in different periods.

Figure 16A:
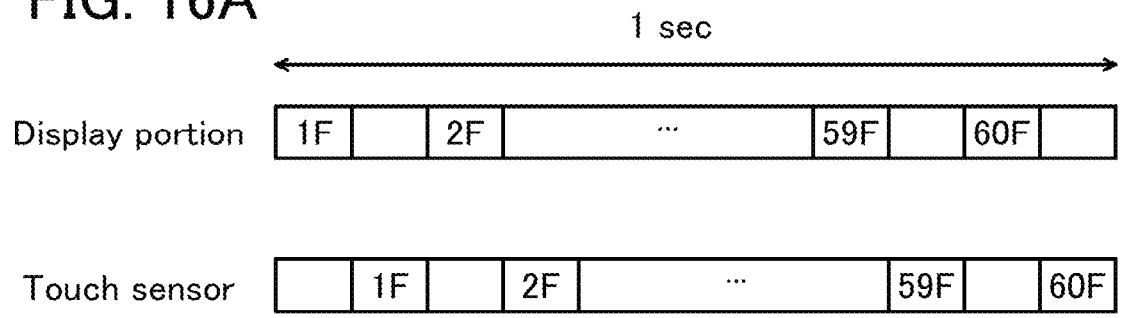
FIGS. 16A to 16D show the operations of a display portion and a touch sensor.
Figure 16B:
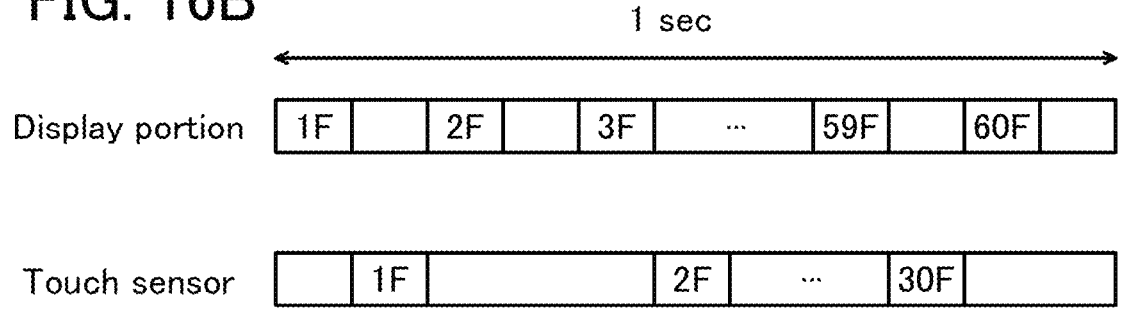

FIG. 16A shows an example in which rewriting of data signals in a display portion and sensing by a touch sensor are performed alternately. FIG. 16B shows an example in which sensing by a touch sensor is performed one time every two rewritings of data signals in a display portion. Note that sensing by a touch sensor may be performed once every three or more rewritings.

In the case where an oxide semiconductor is used in a semiconductor layer (where a channel is formed) of a transistor used in the pixel pix, off-state current can be significantly reduced and the frequency of rewriting data signal can be sufficiently reduced. Specifically, a sufficiently long break period can be set between rewritings of data signals. The break period can be 0.5 seconds or longer, 1 second or longer, or 5 seconds or longer, for example. The upper limit of the break period depends on leakage current of a capacitor or a display element connected to a transistor; for example, 1 minute or shorter, 10 minutes or shorter, 1 hour or shorter, or 1 day or shorter.

Figure 16C:
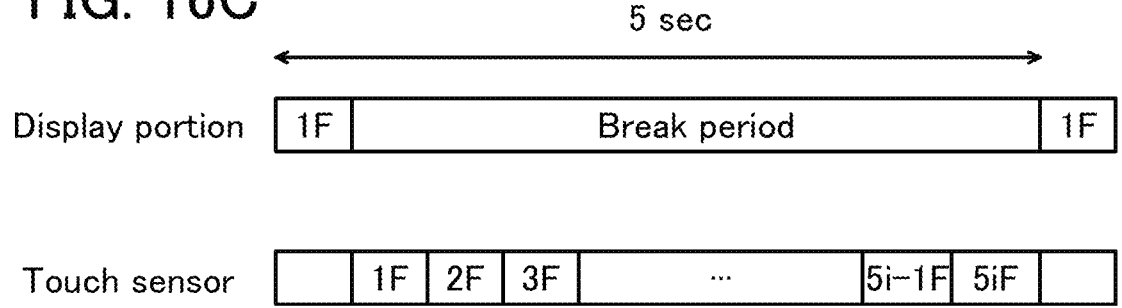
Figure 16D:
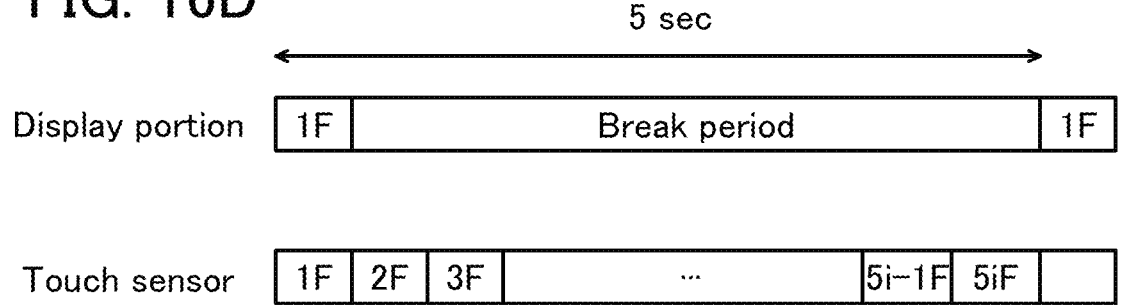

FIG. 16C shows an example in which rewriting of data signals in a display portion is performed once every 5 seconds. A break period for stopping the rewriting operation of a display portion is set in FIG. 16C between rewriting of data signals and next rewriting. In the break period, a touch sensor can be operated at a frame frequency of i Hz (i is more than or equal to the frame frequency of a display device; here, 0.2 Hz or more). Sensing by a touch sensor is performed in a break period and is not performed in a rewriting period of data signals in a display portion as shown in FIG. 16C, so that sensitivity of a touch sensor can be increased. When rewriting of data signals in a display portion and sensing by a touch sensor are performed at the same time as shown in FIG. 16D, operation signals can be simplified.

In a break period during which rewriting of data signals in a display portion is not performed, not only the supply of data signals to the display portion, but also the operation of one or both of the gate driver circuit GD and the source driver circuit SD may be stopped. The supply of power to one or both of the gate driver circuit GD and the source driver circuit SD may also be stopped. Thus, noise is further reduced, and the sensitivity of the touch sensor can be further increased. Moreover, the power consumption of the display device can be further reduced.

The display device of one embodiment of the present invention includes a display portion and a touch sensor between two substrates. With this structure, the distance between the display portion and the touch sensor can be reduced. At this time, noise is easily transmitted to the touch sensor in driving the display portion, which might reduce the sensitivity of the touch sensor. When the driving method in this embodiment is employed, a display device including a touch sensor, which has both reduced thickness and high sensitivity, can be obtained.

This embodiment can be combined with any of the other embodiments as appropriate.

Embodiment 4

Described in this embodiment is a metal oxide that can be used in a semiconductor layer of a transistor disclosed in one embodiment of the present invention. Note that in the case where a metal oxide is used in a semiconductor layer of a transistor, the metal oxide can be rephrased as an oxide semiconductor.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

A cloud-aligned composite OS (CAC-OS) may be used in a semiconductor layer of a transistor disclosed in one embodiment of the present invention.

The aforementioned non-single-crystal oxide semiconductor or CAC-OS can be suitably used in a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used in a semiconductor layer of a transistor. The use of the CAC-OS allows the transistor to have high electrical characteristics or high reliability.

The CAC-OS will be described in detail below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This embodiment can be combined with any of the other embodiments as appropriate.

Embodiment 5

In this embodiment, electronic devices of one embodiment of the present invention are described.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 17A:
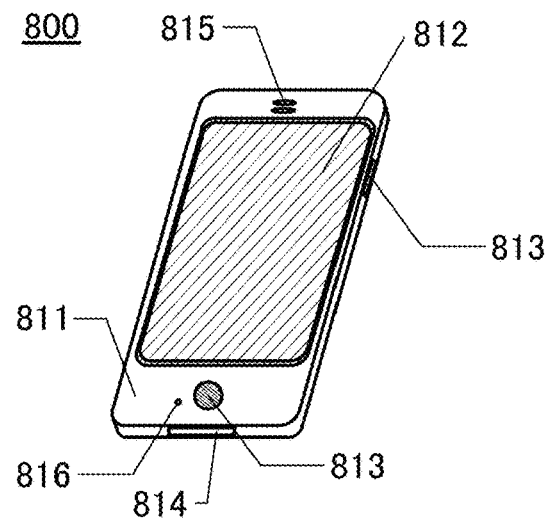
FIGS. 17A to 17C show examples of an electronic device.
Figure 17B:
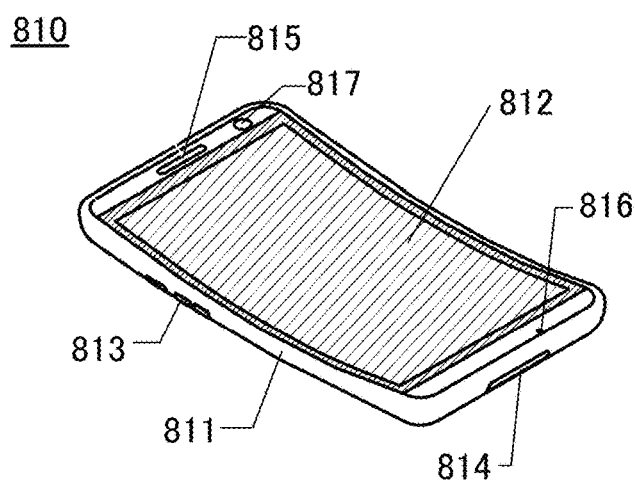
Figure 17C:
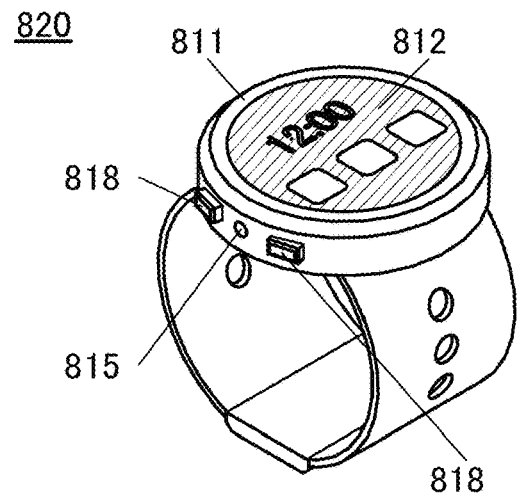

FIGS. 17A to 17C illustrate portable information terminals. Each of the portable information terminals in this embodiment functions as, for example, one or more of a telephone set, a notebook, and an information browsing system. Specifically, each of the portable information terminals in this embodiment can be used as a smartphone or a smart watch. Each of the portable information terminals in this embodiment is capable of executing a variety of applications such as mobile phone calls, e-mailing, text reading and editing, music replay, video replay, Internet communication, and a game, for example. Each of the portable information terminals illustrated in FIGS. 17A to 17C can have a variety of functions. The portable information terminals illustrated in FIGS. 17A to 17C can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the functions of the portable information terminals illustrated in FIGS. 17A to 17C are not limited to the above, and the portable information terminals may have other functions.

Each of the portable information terminals illustrated in FIGS. 17A to 17C is capable of executing a variety of applications such as mobile phone calls, e-mailing, text reading and editing, music replay, Internet communication, and a computer game, for example. Each of the portable information terminals illustrated in FIGS. 17A to 17C can employ near field communication that is a communication method based on an existing communication standard. In that case, for example, mutual communication between the portable information terminal 820 illustrated in FIG. 17C and a headset capable of wireless communication can be performed, and thus hands-free calling is possible.

A portable information terminal 800 illustrated in FIG. 17A includes a housing 811, a display portion 812, operation buttons 813, an external connection port 814, a speaker 815, a microphone 816, and the like. The display portion 812 of the portable information terminal 800 has a flat surface.

A portable information terminal 810 illustrated in FIG. 17B includes the housing 811, the display portion 812, the operation buttons 813, the external connection port 814, the speaker 815, the microphone 816, a camera 817, and the like. The display portion 812 of the portable information terminal 810 has a curved surface.

FIG. 17C illustrates a wrist-watch-type portable information terminal 820. The portable information terminal 820 includes the housing 811, the display portion 812, the speaker 815, operation keys 818 (including a power switch or an operation switch), and the like. The external shape of the display portion 812 of the portable information terminal 820 is circular. The display portion 812 of the portable information terminal 820 has a flat surface.

The display device of one embodiment of the present invention can be used for the display portion 812. Thus, the display portion of the portable information terminal can have a high aperture ratio.

Each of the portable information terminals in this embodiment includes a touch sensor in the display portion 812. Operations such as making a call and inputting a letter can be performed by touch on the display portion 812 with a finger, a stylus, or the like.

With the operation button 813, the power can be turned on or off. In addition, types of images displayed on the display portion 812 can be switched; for example, switching images from a mail creation screen to a main menu screen is performed with the operation button 813.

When a detection device such as a gyroscope sensor or an acceleration sensor is provided inside each of the portable information terminals, the direction of display on the screen of the display portion 812 can be automatically changed by determining the orientation of the portable information terminal (whether the portable information terminal is placed horizontally or vertically). Furthermore, the direction of display on the screen can be changed by touch on the display portion 812, operation with the operation button 813, sound input using the microphone 816, or the like.

Figure 18A:
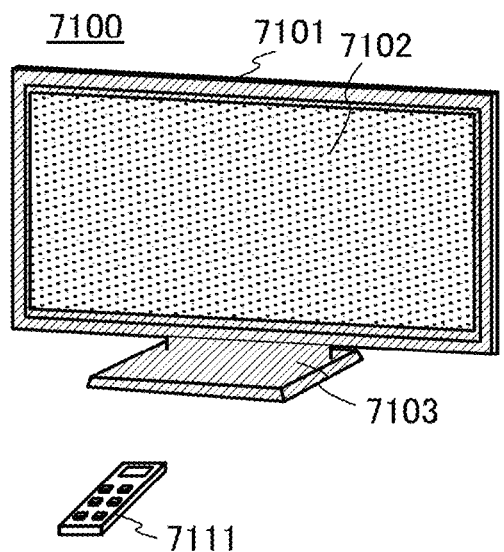
FIGS. 18A to 18C show examples of an electronic device.

In a television device 7100 illustrated in FIG. 18A, a display portion 7102 is incorporated in a housing 7101. The display portion 7102 is capable of displaying images. The display device of one embodiment of the present invention can be used for the display portion 7102. Accordingly, a television device having a display portion with a high aperture ratio can be manufactured. In addition, here, the housing 7101 is supported by a stand 7103.

The television device 7100 can be operated with an operation switch provided in the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 18B:
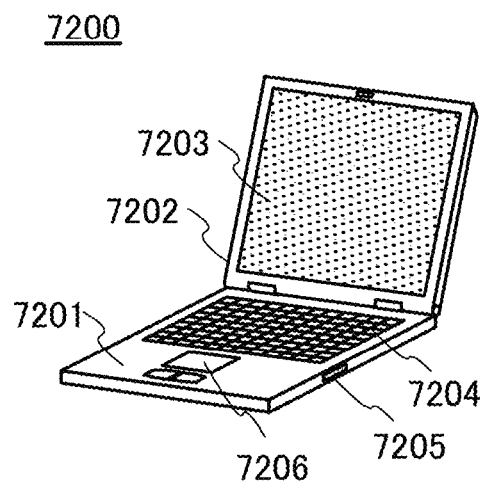

A computer 7200 illustrated in FIG. 18B includes a main body 7201, a housing 7202, a display portion 7203, a keyboard 7204, an external connecting port 7205, a pointing device 7206, and the like. Note that this computer is manufactured by using the display device of one embodiment of the present invention for the display portion 7203. Thus, the display portion of the computer can have a high aperture ratio.

Figure 18C:
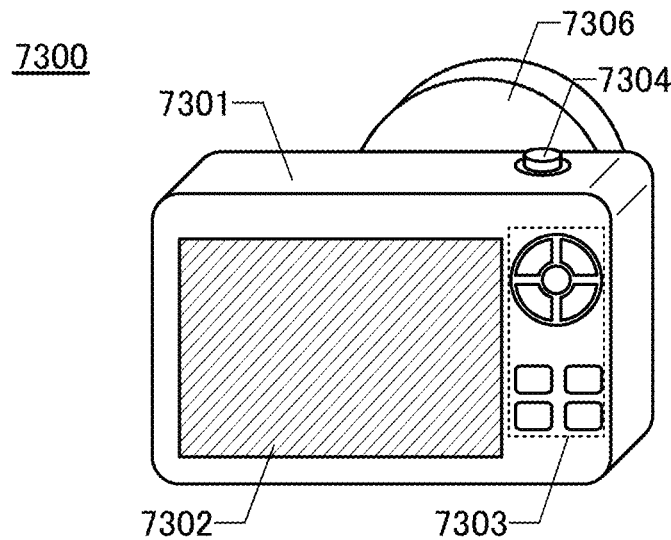

The camera 7300 illustrated in FIG. 18C includes a housing 7301, a display portion 7302, an operation button 7303, a shutter button 7304, and the like. Furthermore, an attachable lens 7306 is attached to the camera 7300.

The display device of one embodiment of the present invention can be used for the display portion 7302. Thus, the display portion of the camera can have a high aperture ratio.

Although the lens 7306 of the camera 7300 here is detachable from the housing 7301 for replacement, the lens 7306 may be included in the housing 7301.

Still images or moving images can be taken with the camera 7300 by pushing the shutter button 7304. In addition, images can be taken by a touch on the display portion 7302 that serves as a touch panel.

Note that a stroboscope, a viewfinder, or the like can be additionally attached to the camera 7300. Alternatively, they may be incorporated in the housing 7301.

This embodiment can be combined with any of other embodiments as appropriate.

Example 1

Described in this example are a cross-sectional structure of a display portion and a scan line driver circuit portion of a display device of one embodiment of the present invention and the measurement results of the light transmittance of a contact portion where a transistor and a pixel electrode are in contact with each other in a display region.

Figure 19:
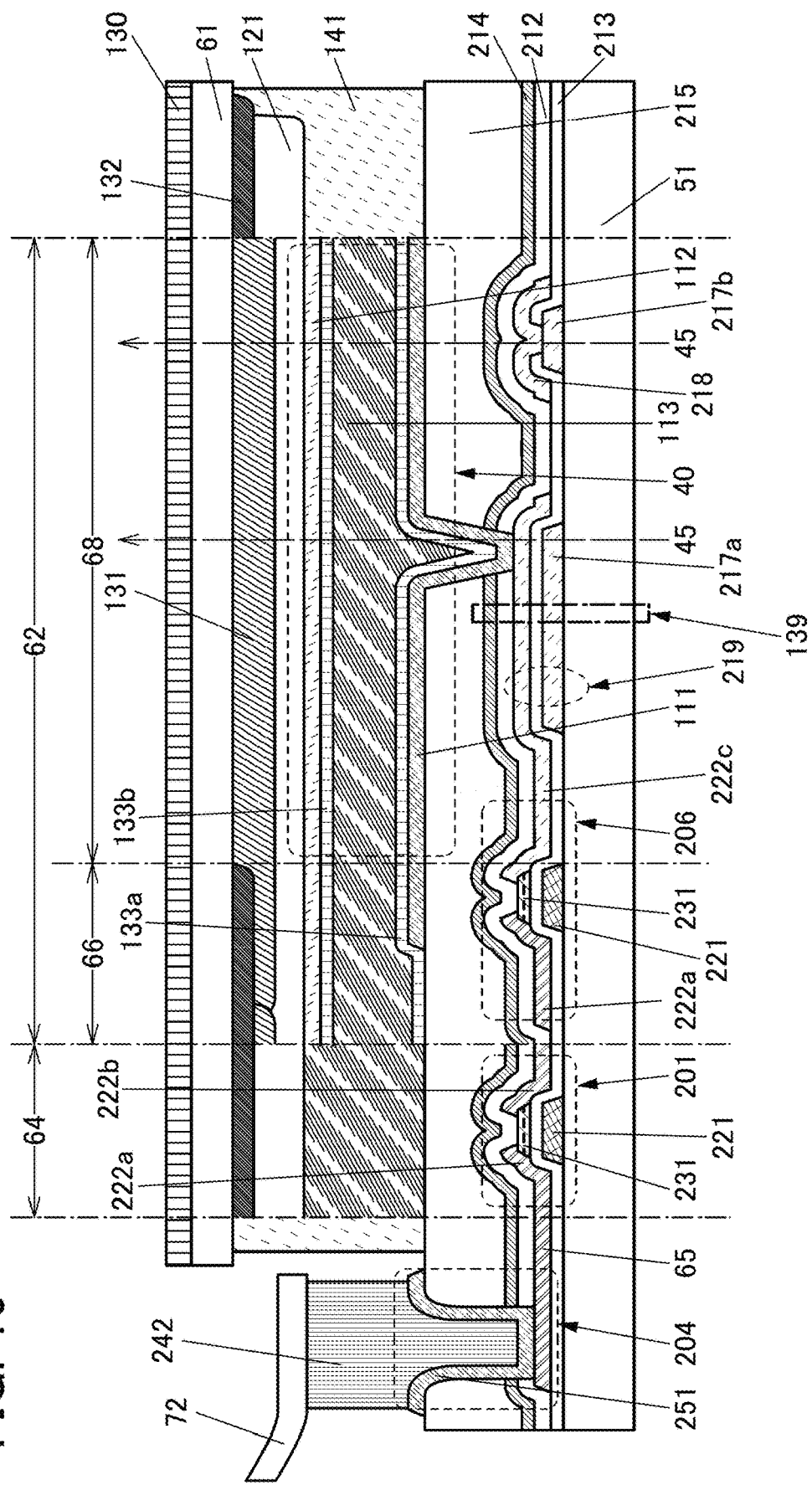
FIG. 19 is a cross-sectional view showing a display device of Example 1.

FIG. 19 shows the cross-sectional structure of the display portion and the scan line driver circuit portion of the display device of this example.

The display device shown in FIG. 19 is an example of a transmissive liquid crystal display device that includes a liquid crystal element with a vertical electric field mode.

As shown in FIG. 19, the display device includes the substrate 51, the transistor 201, the transistor 206, the liquid crystal element 40, the capacitor 219, the alignment film 133a, the alignment film 133b, the connection portion 204, the adhesive layer 141, the coloring layer 131, the light-blocking layer 132, the overcoat 121, the substrate 61, the polarizer 130, and the like.

The display portion 62 includes the transistor 206, the liquid crystal element 40, and the capacitor 219.

The transistor 206 includes the gate 221, the insulating layer 213, the conductive layer 222a, the conductive layer 222c, and the semiconductor layer 231.

Each of the conductive layers 222a and 222c is connected to the semiconductor layer 231.

The liquid crystal element 40 is a liquid crystal element with a VA mode. The liquid crystal element 40 includes the pixel electrode 111, the common electrode 112, and the liquid crystal layer 113. The liquid crystal layer 113 is positioned between the pixel electrode 111 and the common electrode 112.

The pixel electrode 111 is electrically connected to the semiconductor layer 231 of the transistor 206 with the conductive layer 222c positioned therebetween.

The conductive layer 222c functions as one of a pair of electrodes of the capacitor 219. A conductive layer 217a functions as the other of the pair of electrodes of the capacitor 219. The conductive layer 222c and the conductive layer 217a overlap with each other with the insulating layer 213 positioned therebetween. A conductive layer 217b and the conductive layer 218 are connected to each other.

The semiconductor layer 231, the conductive layer 222c, the conductive layer 217a, the conductive layer 217b, and the conductive layer 218 are formed using a conductive material that transmits visible light. The conductive layer 217a and the conductive layer 217b can be formed using the same manufacturing step and the same material. The conductive layer 218 and the conductive layer 222c can be formed using the same manufacturing step and the same material. Thus, the contact portion where the pixel electrode 111 and the transistor 206 are in contact with each other, the contact portion where the conductive layer 217b and the conductive layer 218 are in contact with each other, and the capacitor 219 can be provided in the display region 68. Accordingly, the aperture ratio can be increased.

Examples of materials and formation methods of the layers included in the transistor 206 shown in FIG. 19 are described.

First, a conductive film that transmits visible light (e.g., ITSO) is formed as the conductive layer 217a and the conductive layer 217b, and then, a metal film such as a Cu film is formed by a sputtering method as the gate 221. The metal film functions as a scan line. With the use of this metal film, the gate 221 and a gate wiring of a transistor in the peripheral circuit can be formed in the same manufacturing step.

Then, a stack of a silicon nitride film and a silicon oxynitride film is formed as the insulating layer 213 functioning as a gate insulating layer. Then, a stack of a CAC-OS film and a CAAC-OS film is formed by a sputtering method as the semiconductor layer 231. In the case where the CAAC-OS film with high chemical solution resistance and high plasma resistance is formed over the CAC-OS film, the semiconductor layer 231 is less damaged in the manufacturing process of the transistor. Then, an indium zinc oxide film is formed by a sputtering method as the conductive layer 222c functioning as a source electrode or a drain electrode. The semiconductor layer 231 and the conductive layer 222c can be formed by wet etching. In order to increase the selectivity so that the semiconductor layer 231 is not etched at the time of forming the conductive layer 222c, the conductive layer 222c is preferably formed using an etchant different from that used for forming the semiconductor layer 231. With the use of this indium zinc oxide film, the conductive layer 222c and the conductive layer 218 can be formed using the same manufacturing step.

Then, a metal film such as a Cu film is formed by a sputtering method as the signal line and the conductive layer 222a. With the use of this metal film, the signal line, the conductive layer 222a, and a source wiring and a drain wiring of a transistor in the peripheral circuit can be formed using the same manufacturing step.

Then, the insulating layer 212 and the insulating layer 214 functioning as a passivation film are formed by stacking a silicon oxynitride film and a silicon nitride film using a PECVD apparatus. Then, an acrylic resin is applied as the insulating layer 215 having a planarization function, and an opening portion (a contact opening) is formed. Then, an ITO film is formed as the pixel electrode 111.

Note that a Cu film that is formed as the scan line is preferably used for the gate electrode of the transistor included in the pixel. The Cu film can suppress irradiation of a channel formation region with light emitted from the backlight. In FIG. 7, the contact portion where the transistor 206 and the pixel electrode 111 are in contact with each other and the capacitor 219 can transmit visible light.

Figure 20:
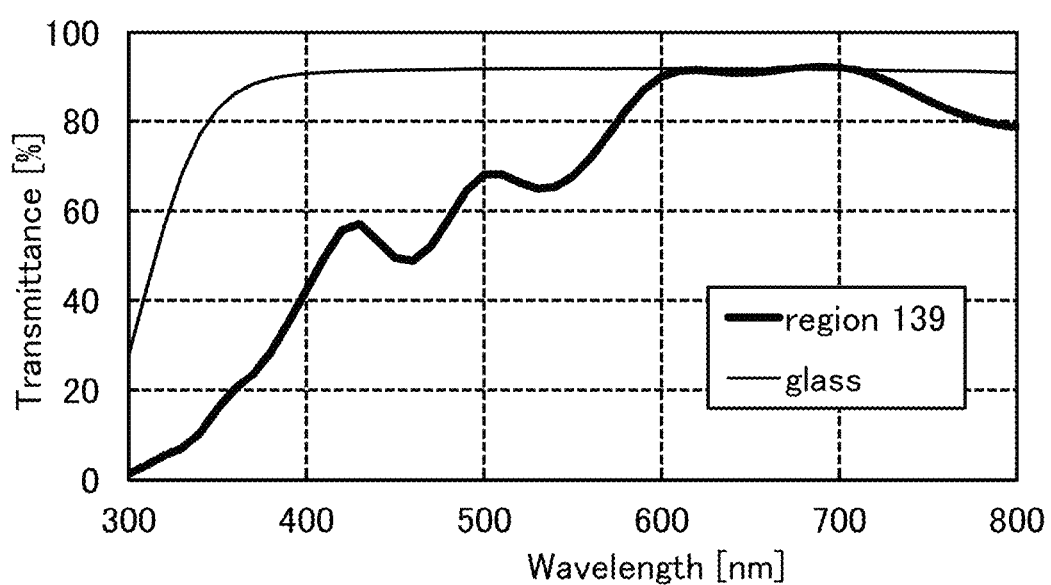
FIG. 20 shows the light transmittance of a layered structure included in a display device of Example 1.

A layered structure capable of being used for a region 139 shown in FIG. 19 was formed, and the light transmittance thereof was measured. FIG. 20 shows the measurement results. Note that FIG. 20 also shows the light transmittance of glass (the substrate 51). The light transmittance was measured with U-4100 Spectrophotometer (manufactured by Hitachi High-Tech Science Corporation).

It is confirmed from FIG. 20 that the layered structure for increasing the aperture ratio can transmit visible light. Accordingly, it is suggested that the power consumption of a backlight can be decreased when a visible light transmitting material is used in the contact portion where the transistor 206 and the pixel electrode 111 are in contact with each other, the capacitor 219, and the like.

Example 2

Described in this example are a cross-sectional structure of a display portion and a scan line driver circuit portion of a display device of one embodiment of the present invention and the measurement results of the light transmittance of a transistor positioned in a display region.

A manufacturing method of a transistor included in the display portion of the display device of this example is described with reference to FIGS. 21A1, 21B1, and 21C1 and FIGS. 22A1, 22B1, 22C1, and 22D1. A manufacturing method of a transistor included in the scan line driver circuit portion of the display device of this example is described with reference to FIGS. 21A2, 21B2, and 21C2 and FIGS. 22A2, 22B2, 22C2, and 22D2.

First, a conductive layer 217s is formed over the substrate 51, and a conductive layer 224s is formed over the conductive layer 217s (FIGS. 21A1 and 21A2). The conductive layer 217s is formed using a conductive material that transmits visible light (e.g., ITSO). The conductive layer 224s is preferably formed using a conductive material with lower resistance than the conductive layer 217s, such as metal. For example, a metal film such as a Cu film is formed by a sputtering method as the conductive layer 224s.

Then, the conductive layer 217s and the conductive layer 224s are processed to form a gate (FIGS. 21B1 and 21B2). In the display portion, the island-like conductive layer 217 is formed (FIG. 21B1). In the scan line driver circuit portion, a layered structure of the island-like conductive layer 217 and an island-like conductive layer 224 is formed (FIG. 21B2). The gate is preferably formed using a multi-tone mask (a halftone mask, a gray-tone mask, or the like). In the case where a multi-tone mask is used, a gate that transmits visible light can be formed in the display portion, and a low-resistance gate and a low-resistance gate wiring can be formed in the scan line driver circuit portion without increasing the number of masks.

Then, the insulating layer 213 functioning as a gate insulating layer is formed, and the semiconductor layer 231 is formed over the insulating layer 213 (FIGS. 21C1 and 21C2). In this example, the insulating layer 213 is formed by stacking a silicon nitride film and a silicon oxynitride film. In this example, the semiconductor layer 231 is formed by stacking a CAC-OS film and a CAAC-OS film by a sputtering method. When the CAAC-OS film with high chemical solution resistance and high plasma resistance is formed over the CAC-OS film, the semiconductor layer 231 is less damaged in the manufacturing process of the transistor. When an oxide semiconductor is used, the semiconductor layer 231 that transmits visible light can be formed.

Then, a conductive layer 222s is formed, and a conductive layer 222t is formed over the conductive layer 222s (FIGS. 22A1 and 22A2). The conductive layer 222s is formed using a conductive material that transmits visible light. In this example, an indium zinc oxide film is formed as the conductive layer 222s. The conductive layer 222t is preferably formed using a conductive material with lower resistance than the conductive layer 222s, such as metal.

Then, the conductive layer 222s and the conductive layer 222t are processed to form a source and a drain (FIGS. 22B1 and 22B2). In the display portion and the scan line driver circuit portion, the island-like conductive layer 222b and the island-like conductive layer 222c that are connected to a part of the semiconductor layer 231 are formed (FIGS. 22B1 and 22B2). In the display portion, the conductive layer 222t remains only in a portion corresponding to the island-like conductive layer 222a connected to a part of the island-like conductive layer 222b, so that a large part of the transistor transmits visible light (FIG. 22B1). In the scan line driver circuit portion, the island-like conductive layer 222a and an island-like conductive layer 222d formed by processing the conductive layer 222t are provided over the island-like conductive layer 222b and the island-like conductive layer 222c (FIG. 22B2). The source and the drain as well as the gates are preferably formed with a multi-tone mask. In the case where a multi-tone mask is used, a source and a drain that transmit visible light can be formed in the display portion, and a low-resistance source, a low-resistance drain, a low-resistance source wiring, and a low-resistance drain wiring can be formed in the driver circuit portion without increasing the number of masks. The semiconductor layer 231, the source, and the drain can be formed by wet etching. In order to increase the selectively so that the semiconductor layer 231 is not etched at the time of forming the source and the drain, the source and the drain are preferably formed using an etchant different from that used for forming the semiconductor layer 231.

Then, the insulating layer 212 functioning as a gate insulating layer is formed, and the gate 223 is formed over the insulating layer 212. The gate 223 is formed using a conductive material that transmits visible light. In this example, the insulating layer 212 is formed by stacking a silicon oxynitride film and a silicon nitride film with a PECVD apparatus. As shown in FIGS. 22C1 and 22C2, the gate 223 may be provided only in the scan line driver circuit portion. As shown in FIGS. 22D1 and 22D2, the gate 223 may be provided in each of the display portion and the scan line driver circuit portion.

Thus, the transistor of the display device of this example can be manufactured.

Figure 23:
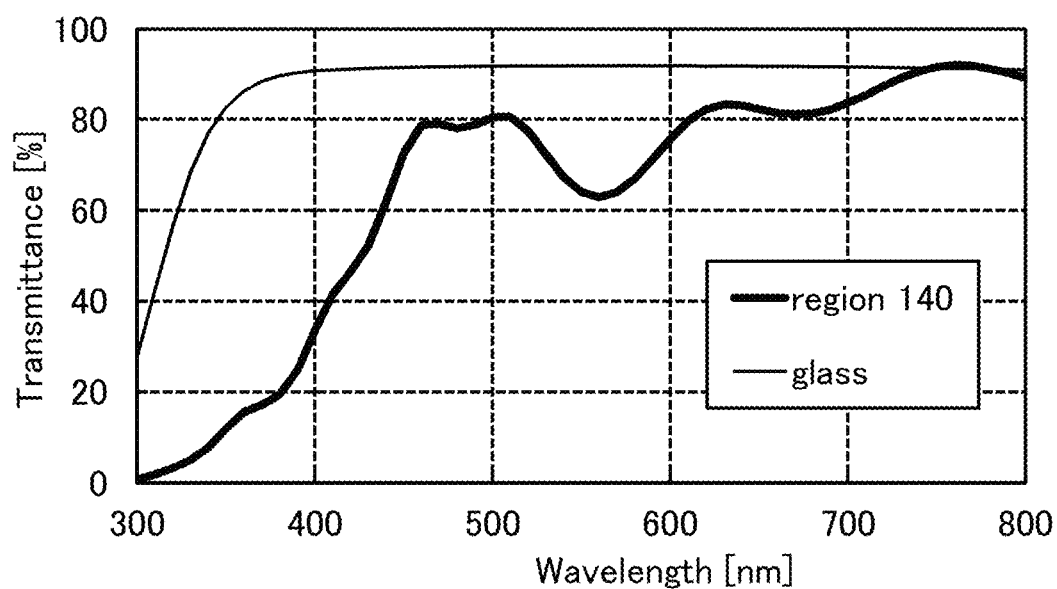
FIG. 23 shows the light transmittance of a layered structure included in a display device of Example 2.

A layered structure capable of being used for a region 140 shown in FIG. 22C1 was formed, and the light transmittance thereof was measured. FIG. 23 shows the measurement results. Note that FIG. 23 also shows the light transmittance of glass (the substrate 51). The light transmittance was measured with U-4100 Spectrophotometer (manufactured by Hitachi High-Tech Science Corporation).

It is confirmed from FIG. 23 that the layered structure formed to increase the aperture ratio can transmit visible light. Thus, it is suggested that the use of a visible light transmitting material in a large part of the transistor in the display portion can reduce the power consumption of a backlight.

This application is based on Japanese Patent Application Serial No. 2016-233560 filed with Japan Patent Office on Nov. 30, 2016 and Japanese Patent Application Serial No. 2017-099002 filed with Japan Patent Office on May 18, 2017, the entire contents of which are hereby incorporated by reference.

What is claimed is:

1. A display device comprising:
   a transistor; and
   a pixel electrode,
   wherein the transistor comprises a semiconductor layer comprising a channel,
   wherein the semiconductor layer comprises a first metal oxide layer and a second metal oxide layer over the first metal oxide layer,
   wherein the first metal oxide layer comprises a region with crystallinity lower than crystallinity in the second metal oxide layer,
   wherein the second metal oxide layer comprises a crystal region with c-axis alignment,
   wherein the transistor comprises a gate electrode below the semiconductor layer to overlap with the semiconductor layer with an insulating layer therebetween,
   wherein the insulating layer is configured to be a gate insulating layer,
   wherein the transistor comprises a third metal oxide layer configured to one of a source electrode and a drain electrode,
   wherein the third metal oxide layer comprises a region in contact with the pixel electrode,
   wherein each of the third metal oxide layer and the pixel electrode transmits visible light,
   wherein the transistor comprises a conductive layer configured to the other of the source electrode and the drain electrode,
   wherein the conductive layer blocks the visible light,
   wherein each of the third metal oxide layer and the conductive layer are in contact with a top surface of the insulating layer,
   wherein a part of the third metal oxide layer is in contact with a first region of a top surface of the second metal oxide layer, and a part of the conductive layer is in contact with a second region of the top surface of the second metal oxide layer,
   wherein each of the first metal oxide layer, the second metal oxide layer, and the third metal oxide layer comprises indium, zinc, and a metal M,
   wherein the metal M is any one of aluminum, gallium, yttrium, and tin, and
   wherein the third metal oxide layer has a higher hydrogen concentration than the first metal oxide layer and the second metal oxide layer.

2. The display device according to claim 1,
   wherein in each of the first metal oxide layer, the second metal oxide layer, and the third metal oxide layer, an atomic ratio of the indium to the metal M to the zinc is 4:x:y,
   wherein the x is greater than or equal to 1.5 and less than or equal to 2.5, and
   wherein the y is greater than or equal to 2 and less than or equal to 4.

3. The display device according to claim 1,
   wherein the conductive layer comprises a fourth metal oxide layer and an island-shaped conductive layer over the fourth metal oxide layer,
   wherein the fourth metal oxide layer transmits visible light,
   wherein the island-shaped conductive layer blocks the visible light,
   wherein the fourth metal oxide layer is in contact with the top surface of the insulating layer and the second region of the top surface of the second metal oxide layer,
   wherein the island-shaped conductive layer is in contact with a part of a top surface of the fourth metal oxide layer,
   wherein the island-shaped conductive layer is configured not to overlap with the second region with the fourth metal oxide layer, and
   wherein the island-shaped conductive layer is not contact with the insulating layer.

* * * * *